United States Patent
Zhang et al.

(10) Patent No.: US 10,950,179 B2
(45) Date of Patent: Mar. 16, 2021

(54) PIXEL CIRCUIT, DISPLAY PANEL, DISPLAY DEVICE, AND DRIVING METHOD

(71) Applicants: ORDOS YUANSHENG OPTOELECTRONICS CO., LTD., Inner Mongolia (CN); BOE TECHNOLOGY GROUP CO., LTD., Beijing (CN)

(72) Inventors: Yi Zhang, Beijing (CN); Kai Zhang, Beijing (CN); Minghua Xuan, Beijing (CN); Young Yik Ko, Beijing (CN); Lujiang Huangfu, Beijing (CN)

(73) Assignees: ORDOS YUANSHENG OPTOELECTRONICS CO., LTD., Ordos (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/882,984

(22) Filed: May 26, 2020

(65) Prior Publication Data

US 2020/0286432 A1    Sep. 10, 2020

Related U.S. Application Data

(63) Continuation-in-part of application No. 15/569,243, filed on Oct. 25, 2017, now Pat. No. 10,692,434.

(30) Foreign Application Priority Data

Aug. 22, 2016 (CN) .......................... 201610703367.9

(51) Int. Cl.
   *G09G 3/3258*     (2016.01)
   *G09G 3/3266*     (2016.01)
   *G09G 3/3275*     (2016.01)
   *H01L 27/32*      (2006.01)

(52) U.S. Cl.
   CPC ......... *G09G 3/3258* (2013.01); *G09G 3/3266* (2013.01); *G09G 3/3275* (2013.01); *H01L 27/3276* (2013.01)

(58) Field of Classification Search
   None
   See application file for complete search history.

(56) References Cited

U.S. PATENT DOCUMENTS

| 8,537,077 B2 | 9/2013 | Lee et al. |
| 2006/0176251 A1 | 8/2006 | Park et al. |

(Continued)

FOREIGN PATENT DOCUMENTS

| CN | 1819000 A | 8/2006 |
| CN | 1963905 A | 5/2007 |

(Continued)

OTHER PUBLICATIONS

International Search Report and Written Opinion dated Jun. 28, 2017; PCT/CN2017/079713.

(Continued)

*Primary Examiner* — Nicholas J Lee

(57) ABSTRACT

A pixel circuit, a display panel, a display device, and a driving method. The pixel circuit includes a light emitting element, a driving transistor, a light emitting control circuit, a reset circuit, a threshold compensation circuit, a first data write circuit, and an initializing circuit. The reset circuit includes a first transistor, the first data write circuit includes a third transistor, and a channel length-width ratio of the first transistor is greater than a channel length-width ratio of the third transistor.

20 Claims, 13 Drawing Sheets

(56) References Cited

U.S. PATENT DOCUMENTS

| | | |
|---|---|---|
| 2007/0124633 A1 | 5/2007 | Kim |
| 2008/0150847 A1 | 6/2008 | Kim et al. |
| 2009/0167648 A1 | 7/2009 | Jeon et al. |
| 2009/0174699 A1 | 7/2009 | Fish et al. |
| 2009/0237123 A1 | 9/2009 | Jinta |
| 2011/0102403 A1 | 5/2011 | Kim |
| 2011/0193855 A1 | 8/2011 | Han |
| 2014/0139503 A1 | 5/2014 | Han |
| 2015/0009199 A1 | 1/2015 | In et al. |
| 2016/0012800 A1 | 1/2016 | Han et al. |
| 2016/0035276 A1 | 2/2016 | Yin et al. |
| 2016/0155379 A1 | 6/2016 | Na |
| 2017/0153759 A1 | 6/2017 | Ding et al. |

FOREIGN PATENT DOCUMENTS

| | | |
|---|---|---|
| CN | 100429689 C | 10/2008 |
| CN | 101471032 A | 7/2009 |
| CN | 101540139 A | 9/2009 |
| CN | 103700342 A | 4/2014 |
| CN | 203882587 U | 10/2014 |
| CN | 203882588 U | 10/2014 |
| CN | 204029330 U | 12/2014 |
| CN | 104835454 A | 8/2015 |
| CN | 105243985 A | 1/2016 |
| CN | 106097964 A | 11/2016 |
| CN | 205920745 U | 2/2017 |

OTHER PUBLICATIONS

The First Chinese Office Action dated Mar. 9, 2018; Appln. No. 201610703367.9.

PIXEL CIRCUIT, DISPLAY PANEL, DISPLAY DEVICE, AND DRIVING METHOD

CROSS-REFERENCE TO RELATED APPLICATION

This application is a Continuation-in-Part application of U.S. application Ser. No. 15/569,243, which is the National Stage of International Application No. PCT/CN2017/079713, filed Apr. 7, 2017. The above-quoted U.S. application Ser. No. 15/569,243 claims priority of Chinese Patent Application No. 201610703367.9, filed Aug. 22, 2016, and the entire content disclosed by the Chinese patent application is incorporated herein by reference as part of the present application for all purposes under the U.S. law.

TECHNICAL FIELD

Embodiments of the present disclosure relate to a pixel circuit, a display panel, a display device, and a driving method.

BACKGROUND

In the display field, organic light-emitting diode (OLED) display panels have the characteristics of self-luminescence, high contrast, low power consumption, wide viewing angle, rapid response speed, capability of being applied in flexible panels, wide service temperature range, simple production, etc., and have a wide development prospect.

Due to the above characteristics, OLED display panels may be applicable to devices with a display function such as mobile phones, displays, notebook computers, digital cameras, and instruments and meters.

SUMMARY

An embodiment of the present disclosure provides a pixel circuit, comprising: a storage capacitor including a first end connected with a first node and a second end connected with a second node; an organic light-emitting diode (OLED) including a first electrode connected with a third node; a driving transistor including a gate electrode connected with the first node, wherein the driving transistor is configured to control the OLED to emit light according to a voltage of the first node; a light emitting control circuit configured to receive a light emitting control signal and control an on/off state of the OLED according to the light emitting control signal; a reset circuit configured to receive a reset control signal and write a reset voltage into the first node according to the reset control signal; a threshold compensation circuit configured to receive a first scanning signal and write a compensating voltage into the first node according to the first scanning signal, wherein the compensating voltage is a sum of a first supply voltage and a threshold voltage of the driving transistor; a first data write circuit configured to receive the first scanning signal and a data signal and write the data signal into the second node according to the first scanning signal; a reference voltage write circuit configured to receive a second scanning signal and write a reference voltage into the second node according to the second scanning signal; and an initializing circuit configured to receive the first scanning signal or the reset control signal and write an initializing voltage into the third node according to the first scanning signal or the reset control signal.

For example, in the pixel circuit according to an embodiment of the present disclosure, the initializing voltage is equal to the reset voltage.

For example, in the pixel circuit according to an embodiment of the present disclosure, the OLED further includes a second electrode; the second electrode of the OLED is electrically connected with a second power line to receive a second supply voltage; the first electrode of the OLED is an anode; the second electrode of the OLED is a cathode; and difference between the initializing voltage and the second supply voltage is less than a cut-in voltage of the OLED.

For example, in the pixel circuit according to an embodiment of the present disclosure, the initializing voltage is less than the second supply voltage.

For example, in the pixel circuit according to an embodiment of the present disclosure, the reset circuit includes a first transistor; the threshold compensation circuit includes a second transistor; the first data write circuit includes a third transistor; the reference voltage write circuit includes a fourth transistor; the light emitting control circuit includes a fifth transistor; and the initializing circuit includes a sixth transistor.

For example, in the pixel circuit according to an embodiment of the present disclosure, a gate electrode of the driving transistor is electrically connected with the first node; a first electrode of the driving transistor is electrically connected with a first power line to receive the first supply voltage; and a second electrode of the driving transistor is electrically connected with a fourth node; the first electrode of the OLED is electrically connected with the third node, and a second electrode of the OLED is electrically connected with a second power line to receive a second supply voltage; the first end of the storage capacitor is electrically connected with the first node, and the second end of the storage capacitor is electrically connected with the second node; a gate electrode of the first transistor is electrically connected with a reset control signal line to receive the reset control signal; a first electrode of the first transistor is electrically connected with a reset voltage line to receive the reset voltage; and a second electrode of the first transistor is electrically connected with the first node; a gate electrode of the second transistor is electrically connected with a first scanning signal line to receive the first scanning signal; a first electrode of the second transistor is electrically connected with the first node; and a second electrode of the second transistor is electrically connected with the fourth node; a gate electrode of the third transistor is electrically connected with the first scanning signal line to receive the first scanning signal; a first electrode of the third transistor is electrically connected with a data signal line to receive the data signal; and a second electrode of the third transistor is electrically connected with the second node; a gate electrode of the fourth transistor is electrically connected with a second scanning signal line to receive a second scanning signal; a first electrode of the fourth transistor is electrically connected with a reference voltage line to receive the reference voltage; and a second electrode of the fourth transistor is electrically connected with the second node; a gate electrode of the fifth transistor is electrically connected with a light emitting control signal line to receive the light emitting control signal; a first electrode of the fifth transistor is electrically connected with the third node; and a second electrode of the fifth transistor is electrically connected with the fourth node; and a gate electrode of the sixth transistor is electrically connected with the first scanning signal line or the reset control signal line to receive the first scanning signal or the reset control signal; a first electrode of the sixth transistor is electrically connected with the reset voltage line to receive the reset voltage; and a second electrode of the sixth transistor is electrically connected with the third node.

For example, in the pixel circuit according to an embodiment of the present disclosure, the driving transistor, the first transistor, the second transistor, the third transistor, the fourth transistor, the fifth transistor and the sixth transistor are all P-type transistors.

For example, in the pixel circuit according to an embodiment of the present disclosure, the driving transistor, the first transistor, the second transistor, the third transistor, the fourth transistor, the fifth transistor and the sixth transistor are all thin-film transistors (TFTs).

For example, the pixel circuit according to an embodiment of the present disclosure further comprises a second data write circuit configured to receive the reset control signal and the data signal and write the data signal into the second node according to the reset control signal.

For example, in the pixel circuit according to an embodiment of the present disclosure, the reset circuit includes a first transistor; the threshold compensation circuit includes a second transistor; the first data write circuit includes a third transistor; the reference voltage write circuit includes a fourth transistor; the light emitting control circuit includes a fifth transistor; the initializing circuit includes a sixth transistor; and the second data write circuit includes a seventh transistor.

For example, in the pixel circuit according to an embodiment of the present disclosure, a gate electrode of the driving transistor is electrically connected with the first node; a first electrode of the driving transistor is electrically connected with a first power line to receive the first supply voltage; and a second electrode of the driving transistor is electrically connected with a fourth node; the first electrode of the OLED is electrically connected with the third node, and a second electrode of the OLED is electrically connected with a second power line to receive a second supply voltage; the first end of the storage capacitor is electrically connected with the first node, and the second end of the storage capacitor is electrically connected with the second node; a gate electrode of the first transistor is electrically connected with a reset control signal line to receive the reset control signal; a first electrode of the first transistor is electrically connected with a reset voltage line to receive the reset voltage; and a second electrode of the first transistor is electrically connected with the first node; a gate electrode of the second transistor is electrically connected with a first scanning signal line to receive the first scanning signal; a first electrode of the second transistor is electrically connected with the first node; and a second electrode of the second transistor is electrically connected with the third node; a gate electrode of the third transistor is electrically connected with the first scanning signal line to receive the first scanning signal; a first electrode of the third transistor is electrically connected with a data signal line to receive the data signal; and a second electrode of the third transistor is electrically connected with the second node; a gate electrode of the fourth transistor is electrically connected with a second scanning signal line to receive the second scanning signal; a first electrode of the fourth transistor is electrically connected with a reference voltage line to receive the reference voltage; and a second electrode of the fourth transistor is electrically connected with the second node; a gate electrode of the fifth transistor is electrically connected with a light emitting control signal line to receive the light emitting control signal; a first electrode of the fifth transistor is electrically connected with the third node; and a second electrode of the fifth transistor is electrically connected with the fourth node; a gate electrode of the sixth transistor is electrically connected with the first scanning signal line or the reset control signal line to receive the first scanning signal or the reset control signal; a first electrode of the sixth transistor is electrically connected with the reset voltage line to receive the reset voltage; and a second electrode of the sixth transistor is electrically connected with the third node; and a gate electrode of the seventh transistor is electrically connected with the reset control signal line to receive the reset control signal; a first electrode of the seventh transistor is electrically connected with the data signal line to receive the data signal; and a second electrode of the seventh transistor is electrically connected with the second node.

For example, in the pixel circuit according to an embodiment of the present disclosure, the driving transistor, the first transistor, the second transistor, the third transistor, the fourth transistor, the fifth transistor, the sixth transistor and the seventh transistor are all P-type transistors.

For example, in the pixel circuit according to an embodiment of the present disclosure, the driving transistor, the first transistor, the second transistor, the third transistor, the fourth transistor, the fifth transistor, the sixth transistor and the seventh transistor are all TFTs.

An embodiment of the present disclosure provides a display panel comprises the pixel circuit according to an embodiment of the present disclosure.

For example, the display panel according to an embodiment of the present disclosure further comprises: a data driver configured to provide the data signal for the pixel circuit; and a scan driver configured to provide the light emitting control signal, the first scanning signal, the second scanning signal and the reset control signal for the pixel circuit.

An embodiment of the present disclosure provides a display device, the display device comprises a plurality of sub-pixels, and each of the plurality of sub-pixels comprises the pixel circuit according to any one embodiment of the present disclosure.

For example, the display device provided by an embodiment of the present disclosure further includes: an integrated driving circuit. The integrated driving circuit comprises a second supply voltage output sub-circuit and an initializing voltage output sub-circuit, the second supply voltage output sub-circuit is configured to output a second supply voltage, and the initializing voltage output sub-circuit is configured to output the initializing voltage, the light emitting element further comprises a second electrode, the second electrode of the light emitting element is configured to receive the second supply voltage, the second supply voltage output sub-circuit is coupled to the initializing voltage output sub-circuit, and the initializing voltage output sub-circuit is configured to receive the second supply voltage and adjust the initializing voltage according to the second supply voltage.

For example, in the display device provided by an embodiment of the present disclosure, the plurality of sub-pixels comprise a first sub-pixel and a second sub-pixel, the first sub-pixel and the second sub-pixel are adjacent, a pixel circuit of the first sub-pixel and a pixel circuit of the second sub-pixel are connected to a same reset voltage line, or the pixel circuit of the first sub-pixel and the pixel circuit of the second sub-pixel are connected to a same first power line.

For example, in the display device provided by an embodiment of the present disclosure, the plurality of sub-pixels are arranged in N rows and M columns, the plurality of sub-pixels comprise a first sub-pixel and a second sub-pixel, the first sub-pixel is in a k-th row of the N rows, and the second sub-pixel is in a (k+1)-th row of the N rows, an initializing circuit in a pixel circuit of the first sub-pixel and a reset circuit in a pixel circuit of the second sub-pixel are controlled by a same reset control signal line, the initializing circuit in the pixel circuit of the first sub-pixel and a reset circuit in the pixel circuit of the first sub-pixel are controlled by different reset control signal lines, N, M, and k are positive integers, and k is less than N.

An embodiment of the present disclosure provides a pixel circuit, and the pixel circuit comprises: a light emitting element, comprising a first electrode; a driving transistor, comprising a gate electrode, the driving transistor being coupled to a first supply voltage, and the driving transistor being configured to drive the light emitting element to emit light according to a voltage of the gate electrode of the driving transistor; a light emitting control circuit, configured to receive a light emitting control signal and control a connection between the light emitting element and the driving transistor to be turned on or off according to the light emitting control signal; a reset circuit, configured to receive a reset control signal and write a reset voltage into the gate electrode of the driving transistor according to the reset control signal; a threshold compensation circuit, configured to receive a first scanning signal and write a compensating voltage into the gate electrode of the driving transistor according to the first scanning signal, the compensating voltage comprising a threshold voltage of the driving transistor; a first data write circuit, configured to receive the first scanning signal and a data signal and write the data signal into the driving transistor according to the first scanning signal; an initializing circuit, configured to write an initializing voltage into the first electrode of the light emitting element; the reset circuit comprises a first transistor, and the first data write circuit comprises a third transistor, and a channel length-width ratio of the first transistor is greater than a channel length-width ratio of the third transistor.

For example, in the pixel circuit provided by an embodiment of the present disclosure, the light emitting element further comprises a second electrode, the second electrode of the light emitting element is configured to receive a second supply voltage, a difference between the initializing voltage and the second supply voltage is in a range of 0 to 3 volts, or the initializing voltage is less than or equal to the second supply voltage.

For example, in the pixel circuit provided by an embodiment of the present disclosure, the first transistor is a double-gate transistor, and the channel length-width ratio of the first transistor is in a range of 3 to 7.

For example, in the pixel circuit provided by an embodiment of the present disclosure, the threshold compensation circuit comprises a second transistor, the second transistor is a double-gate transistor, and a channel length-width ratio of the second transistor is in a range of 1 to 3.

For example, in the pixel circuit provided by an embodiment of the present disclosure, a channel length-width ratio of the driving transistor is in a range of 8 to 13.

For example, in the pixel circuit provided by an embodiment of the present disclosure, the driving transistor further comprises an active layer, the active layer of the driving transistor comprises a curved portion, and a shape of the curved portion of the active layer of the driving transistor is an S-shape.

For example, in the pixel circuit provided by an embodiment of the present disclosure, the first transistor comprises an active layer, and the active layer of the first transistor comprises a curved portion, and a shape of the curved portion of the active layer of the first transistor is a shape of "~".

For example, in the pixel circuit provided by an embodiment of the present disclosure, the reset voltage changes within a display period of one frame.

For example, in the pixel circuit provided by an embodiment of the present disclosure, the initializing voltage is a variable voltage, and the initializing voltage is positively correlated with the second supply voltage and varies with variance of the second supply voltage.

For example, the pixel circuit provided by an embodiment of the present disclosure further includes: a storage capacitor and a reference voltage write circuit, the storage capacitor comprises a first end and a second end, the first end of the storage capacitor is connected to the gate electrode of the driving transistor; the reference voltage write circuit is connected to the second end of the storage capacitor, and is configured to receive a second scanning signal and write a reference voltage to the second end of the storage capacitor according to the second scanning signal.

For example, in the pixel circuit provided by an embodiment of the present disclosure, the threshold compensation circuit comprises a second transistor, the reference voltage write circuit comprises a fourth transistor, the light emitting control circuit comprises a fifth transistor, and the initializing circuit comprises a sixth transistor, the gate electrode of the driving transistor is electrically connected with the first end of the storage capacitor; a first electrode of the driving transistor is electrically connected with a first power line to receive the first supply voltage; the light emitting element further comprises a second electrode that is electrically connected with a second power line to receive a second supply voltage; a gate electrode of the first transistor is electrically connected with a reset control signal line to receive the reset control signal; a first electrode of the first transistor is electrically connected with a reset voltage line to receive the reset voltage; and a second electrode of the first transistor is electrically connected with the gate electrode of the driving transistor; a gate electrode of the second transistor is electrically connected with a first scanning signal line to receive the first scanning signal; a first electrode of the second transistor is electrically connected with the gate electrode of the driving transistor; and a second electrode of the second transistor is electrically connected with a second electrode of the driving transistor, the compensating voltage is a sum of the first supply voltage and the threshold voltage of the driving transistor; a gate electrode of the third transistor is electrically connected with the first scanning signal line to receive the first scanning signal; a first electrode of the third transistor is electrically connected with a data signal line to receive the data signal; and a second electrode of the third transistor is electrically connected with the second end of the storage capacitor; a gate electrode of the fourth transistor is electrically connected with a second scanning signal line to receive a second scanning signal; a first electrode of the fourth transistor is electrically connected with a reference voltage line to receive the reference voltage; and a second electrode of the fourth transistor is electrically connected with the second end of the storage capacitor; a gate electrode of the fifth transistor is electrically connected with a light emitting control signal line to receive the light emitting control signal; a first electrode of the fifth transistor is electrically connected with the first electrode of the light emitting element; and a second electrode of the fifth transistor is electrically connected with the second electrode of the driving transistor; a gate electrode of the sixth transistor is electrically connected with the first scanning signal line or the reset control signal line to receive the first scanning signal or the reset control signal; a first electrode of the sixth transistor is electrically connected with an initializing voltage line to receive the initializing voltage; and a second electrode of the sixth transistor is electrically connected with the first electrode of the light emitting element.

For example, in the pixel circuit provided by an embodiment of the present disclosure, the reset voltage line and the initializing voltage line are a same signal line.

For example, in the pixel circuit provided by an embodiment of the present disclosure, the reference voltage line and the first electrode of the light emitting element are in a same layer and formed of a same material, the reference voltage line and the first electrode of the fourth transistor are in different layers, and the reference voltage line is connected to the first electrode of the fourth transistor through a hole.

For example, the pixel circuit provided by an embodiment of the present disclosure further comprises an active semiconductor layer and a first conductive layer, the driving transistor further comprises an active layer, the second transistor further comprises an active layer, and the fifth transistor further comprises an active layer, the light emitting control signal line and the first scanning signal line are in the first conductive layer, and in the first conductive layer, the light emitting control signal line and the first scanning signal line are arranged along a first direction and extend along a second direction, the active layer of the driving transistor, the active layer of the second transistor, and the active layer of the fifth transistor are in the active semiconductor layer, the active layer of the driving transistor comprises a curved portion, and a shape of the curved portion of the active layer of the driving transistor is an S-shape, the active semiconductor layer comprises a conductive portion between a channel of the active layer of the second transistor and a channel of the active layer of the fifth transistor, in the first direction, the conductive portion is between the light emitting control signal line and the first scanning signal line, a length of the conductive portion in the first direction is greater than a length of the curved portion of the active layer of the driving transistor in the first direction.

An embodiment of the present disclosure provides a display device, comprising the display panel according to an embodiment of the present disclosure.

An embodiment of the present disclosure provides a driving method of the pixel circuit according to an embodiment of the present disclosure, comprising a reset period, a data write and threshold compensation period, a voltage drop compensation period, and an emission period within the display period of one frame, wherein in the reset period, the light emitting control signal is set to be a turn-off voltage; the reset control signal is set to be a turn-on voltage; the first scanning signal is set to be a turn-off voltage; the second scanning signal is set to be a turn-on voltage; the data signal is set to be an ineffective data signal; in the data write and threshold compensation period, the light emitting control signal is set to be a turn-off voltage; the reset control signal is set to be a turn-off voltage; the first scanning signal is set to be a turn-on voltage; the second scanning signal is set to be a turn-off voltage; the data signal is set to be an effective data signal; in the voltage drop compensation period, the light emitting control signal is set to be a turn-off voltage; the reset control signal is set to be a turn-off voltage; the first scanning signal is set to be a turn-off voltage; the second scanning signal is set to be a turn-on voltage; the data signal is set to be an ineffective data signal; and in the emission period, the light emitting control signal is set to be a turn-on voltage; the reset control signal is set to be a turn-off voltage; the first scanning signal is set to be a turn-off voltage; the second scanning signal is set to be a turn-on voltage; and the data signal is set to be an ineffective data signal.

An embodiment of the present disclosure provides a driving method of the pixel circuit according to an embodiment of the present disclosure, comprising a reset period, a data write and threshold compensation period, a voltage drop compensation period and an emission period within the display period of one frame, wherein in the reset period, the light emitting control signal is set to be a turn-off voltage; the reset control signal is set to be a turn-on voltage; the first scanning signal is set to be a turn-off voltage; the second scanning signal is set to be a turn-off voltage; the data signal is set to be an effective data signal; in the data write and threshold compensation period, the light emitting control signal is set to be a turn-off voltage; the reset control signal is set to be a turn-off voltage; the first scanning signal is set to be a turn-on voltage; the second scanning signal is set to be a turn-off voltage; the data signal is set to be an effective data signal; in the voltage drop compensation period, the light emitting control signal is set to be a turn-off voltage; the reset control signal is set to be a turn-off voltage; the first scanning signal is set to be a turn-off voltage; the second scanning signal is set to be a turn-on voltage; the data signal is set to be an ineffective data signal; in the emission period, the light emitting control signal is set to be a turn-on voltage; the reset control signal is set to be a turn-off voltage; the first scanning signal is set to be a turn-off voltage; the second scanning signal is set to be a turn-on voltage; and the data signal is set to be an ineffective data signal.

For example, in the driving method according to an embodiment of the present disclosure, a ratio of a duration of the emission period in the display period of one frame is adjustable.

For example, the driving method according to an embodiment of the present disclosure further comprises an emission continuation period within the display period of one frame, wherein the emission continuation period includes at least one shutdown sub-period and at least one emission sub-period; in the shutdown sub-period, the light emitting control signal is set to be a turn-off voltage; the reset control signal is set to be a turn-off voltage; the first scanning signal is set to be a turn-off voltage; the second scanning signal is set to be a turn-on voltage; the data signal is set to be an ineffective data signal; in the emission sub-period, the light emitting control signal is set to be a turn-on voltage; the reset control signal is set to be a turn-off voltage; the first scanning signal is set to be a turn-off voltage; the second scanning signal is set to be a turn-on voltage; and the data signal is set to be an ineffective data signal.

For example, in the driving method according to an embodiment of the present disclosure, a ratio of a sum of a duration of the emission period and total duration of the emission sub-period or emission sub-periods to the display period of one frame is adjustable.

For example, in the driving method according to an embodiment of the present disclosure, a duration of each shutdown sub-period is equal to a sum of a duration of the reset period, a duration of the data write and threshold compensation period, and a duration of the voltage drop compensation period; and a duration of each emission sub-period is equal to a duration of the emission period.

For example, in the driving method according to an embodiment of the present disclosure, during the display period of one frame, the data write and threshold compensation period and the emission period do not overlap in time.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1:
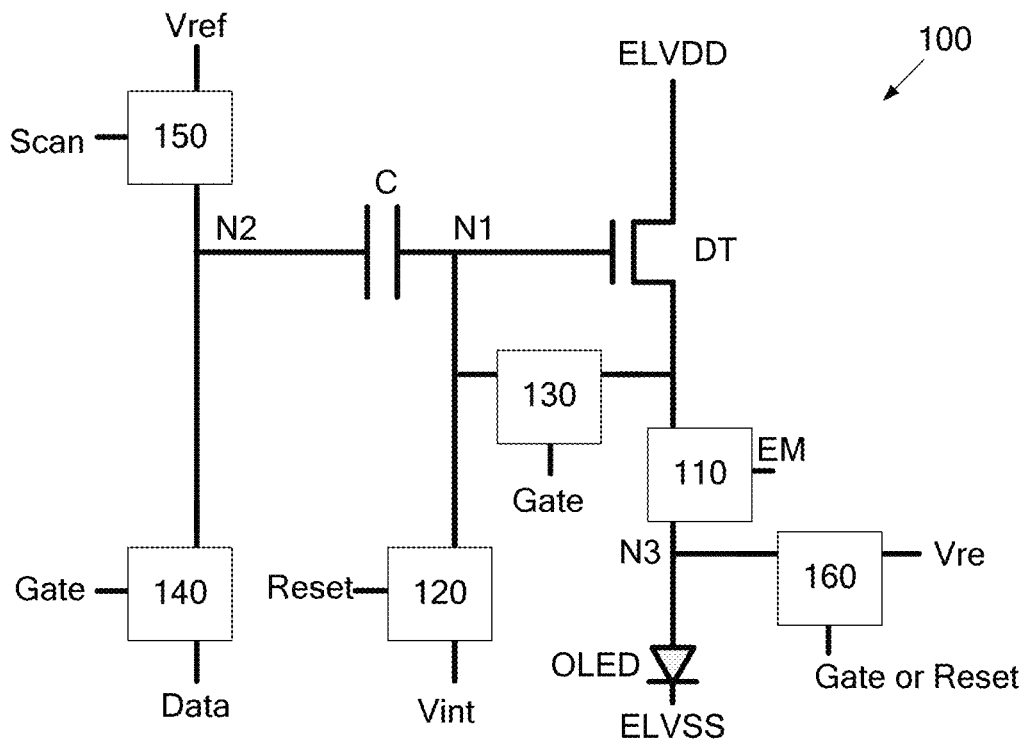
FIG. 1 is a schematic diagram 1 of a pixel circuit provided by the embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. In addition, in the embodiments of the present disclosure, the same or similar reference signs are used to refer to the same or similar components.

The phenomenon of IR drop may occur in an OLED display panel. The IR drop is caused by the resistance voltage division of the leads or wires in the display panel, namely certain voltage drop will be produced over the leads when current runs through the leads in the display panel according to Ohm's law. Thus, the extents to which pixel units at different positions are affected by the IR drop are not the same, and hence nonuniform display of the display panel can be caused. Therefore, the IR drop in the OLED display panel must be compensated.

Moreover, in an OLED display panel, the threshold voltages of driving transistors in the pixel units may be different due to the manufacturing process. Furthermore, due to the influence of, for instance, temperature variation, the threshold voltages of the driving transistors also suffer from drift phenomenon. Thus, the difference among the threshold voltages of the driving transistors may also result in nonuniform display of the display panel. Therefore, the threshold voltages must also be compensated.

Moreover, an OLED pixel compensating circuit may have leakage currents and may still have the brightness of 0.01-0.03 nits in a black state, so absolute black cannot be obtained, and hence high contrast cannot be achieved.

In addition, the gray scale levels of the OLED display device are controlled by the data voltages of the drive circuit. In the case of displaying at a low gray scale (for instance, when used at night), the drive circuit is difficult to realize accurate control under the condition of outputting a low-grayscale data voltage.

An embodiment of the present disclosure provides a pixel circuit, a display panel, a display device, and a driving method, which can achieve the IR drop compensation and the threshold voltage compensation of the display panel, improve the uniformity of drive current, improve the display uniformity of the display panel, meanwhile, reduce the leakage current to ensure high contrast in the black state, and ensure accurate display under a low-grayscale condition by adjustment of the ratio of the emission period in the display period of one frame.

An embodiment of the present disclosure provides a pixel circuit. The pixel circuit comprises a light emitting element, a driving transistor, a light emitting control circuit, a reset circuit, a threshold compensation circuit, a first data write circuit, and an initializing circuit.

For example, the light emitting element includes a first electrode and a second electrode.

The driving transistor includes a gate electrode, the driving transistor is coupled to a first supply voltage, and the driving transistor is configured to drive the light emitting element to emit light according to a voltage of the gate electrode of the driving transistor.

The light emitting control circuit is configured to receive a light emitting control signal and control a connection between the light emitting element and the driving transistor to be turned on or off according to the light emitting control signal.

The reset circuit is configured to receive a reset control signal and write a reset voltage into the gate electrode of the driving transistor according to the reset control signal.

The threshold compensation circuit is configured to receive a first scanning signal and write a compensating voltage into the gate electrode of the driving transistor according to the first scanning signal, the compensating voltage comprises a threshold voltage of the driving transistor.

The first data write circuit is configured to receive the first scanning signal and a data signal and write the data signal into the driving transistor according to the first scanning signal.

The initializing circuit is configured to write an initializing voltage into the first electrode of the light emitting element.

The second electrode of the light emitting element is configured to receive a second supply voltage, a difference between the initializing voltage and the second supply voltage is in a range of 0 to 3 volts (V), so that the initializing voltage and the second supply voltage can be better controlled, and power consumption can be reduced. For example, in some embodiments, the difference between the initializing voltage and the second supply voltage ranges from 0 to 2 volts. For example, in some embodiments, the difference between the initializing voltage and the second supply voltage ranges from 0 to 1.5 volts. For example, in some embodiments, the initializing voltage may be −3V and the second supply voltage is −4.3V, in this case, the difference between the initializing voltage and the second supply voltage (for example, the initializing voltage minus the second supply voltage) is 1.3 V.

It should be noted that a specific value of the difference between the initializing voltage and the second supply voltage can be set according to the actual situations, as long as it can be ensured that the light emitting element does not emit light, or emits invisible light, or meets other display specifications during a non-light-emitting period, that is, as long as it can be ensured that the light emitting element can meet the requirements of the light emitting element in the non-light-emitting period.

For example, in some embodiments, the difference between the initializing voltage and the second supply voltage ranges from 0V to 1V.

For example, in some embodiments, a cut-in voltage of the light emitting element ranges from 0V to 1V, for example, the cut-in voltage of the light emitting element is 0.5 V.

For example, the difference between the initializing voltage and the second supply voltage is less than the cut-in voltage of the light emitting element, for example, if the cut-in voltage of the light emitting element is 0.5 V, the difference between the initializing voltage and the second supply voltage is less than 0.5V.

For example, in some embodiments, the pixel circuit further includes a storage capacitor and a reference voltage write circuit. The light emitting element is an organic light emitting diode (OLED).

For example, as illustrated in FIG. 1, in some examples, the pixel circuit 100 comprises: a storage capacitor C, an organic light emitting diode (OLED), a driving transistor DT, a light emitting control circuit 110, a reset circuit 120, a threshold compensation circuit 130, a first data write circuit 140, a reference voltage write circuit 150, and an initializing circuit 160.

For instance, as shown in FIG. 1, the storage capacitor C includes a first end connected with a first node N1 and a second end connected with a second node N2. The OLED includes a first electrode connected with a third node N3. The driving transistor DT includes a gate electrode connected with the first node N1 and is configured to control the OLED to emit light according to the voltage of the first node N1. The light emitting control circuit 110 is configured to receive a light emitting control signal EM and control the on/off of the OLED according to the light emitting control signal EM. The reset circuit 120 is configured to receive a reset control signal Reset and write a reset voltage Vint into the first node N1 according to the reset control signal Reset. The threshold compensation circuit 130 is configured to receive a first scanning signal Gate and write a compensating voltage to the first node N1 according to the first scanning signal Gate, and the compensating voltage is ELVDD+Vth, i.e., the sum of the first supply voltage ELVDD and the threshold voltage Vth of the driving transistor. The first data write circuit 140 is configured to receive the first scanning signal Gate and a data signal Data and write the data signal Data into the second node N2 according to the first scanning signal Gate. The reference voltage write circuit 150 is configured to receive a second scanning signal Scan and write a reference voltage Vref into the second node N2 according to the second scanning signal Scan. The initializing circuit 160 is configured to receive the first scanning signal Gate or the reset control signal Reset, and write initializing voltage Vre into the third node N3 according to the first scanning signal Gate or the reset control signal Reset.

Figure 2:
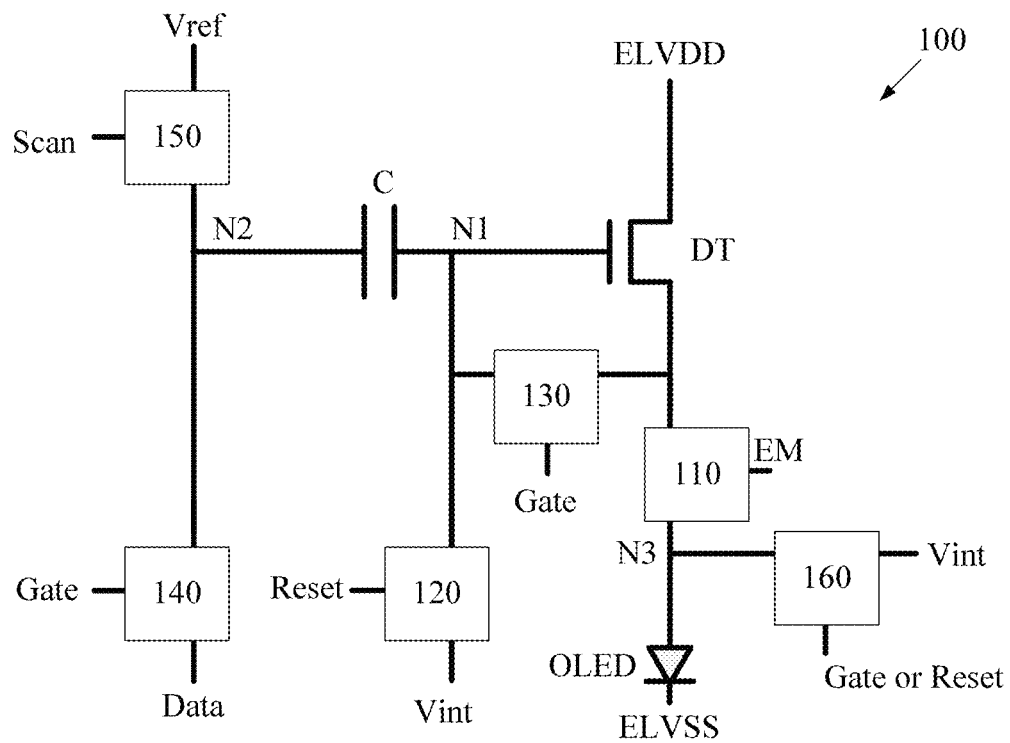
FIG. 2 is a schematic diagram 2 of a pixel circuit provided by the embodiment of the present disclosure.

For instance, as shown in FIG. 2, in the pixel circuit 100 provided by the embodiment of the present disclosure, in some examples, the initializing voltage Vre is equal to the reset voltage Vint. That is to say, the reset voltage may be simultaneously applied to the reset circuit 120 and the initializing circuit 160. This setting can save a voltage output port, simplify the circuit, and reduce the cost.

For instance, as shown in FIG. 2, in the pixel circuit 100 provided by the embodiment of the present disclosure, the OLED further includes a second electrode; and the second electrode of the OLED is electrically connected with a second power line to receive a second supply voltage ELVSS. For instance, the first electrode of the OLED is an anode, and the second electrode of the OLED is a cathode. The difference between the initializing voltage Vre and the second supply voltage ELVSS is less than the cut-in voltage of the OLED. Thus, the initializing circuit 160 writes the initializing voltage Vre into the third node N3 and may initialize the voltage of the third node N3 (namely the voltage of the anode of the OLED). As the difference between the initializing voltage Vre and the second supply voltage ELVSS is less than the cut-in voltage of the OLED, the abnormal light emission of the OLED after initialization can be avoided, and the display quality can be improved. It should be noted that "the difference between the initializing voltage Vre and the second supply voltage ELVSS" may represent the value obtained by subtracting the second supply voltage ELVSS from the initializing voltage Vre or the value obtained by subtracting the initializing voltage Vre from the second supply voltage ELVSS.

For example, in other embodiments, the initializing voltage and the reset voltage are different, that is, the reset circuit 120 and the initializing circuit 160 receive different voltages, respectively.

For example, the reset voltage changes within a display period of one frame. The display period of one frame can include a reset period, a data write and threshold compensation period, a voltage drop compensation period, and an emission period. During the display period of one frame, the voltage value of the reset voltage in the reset period is different from the voltage value of the reset voltage in the remaining periods (that is, the data write and threshold compensation period, the voltage drop compensation period, and the emission period). In the reset period, the reset voltage is transmitted to the gate electrode of the driving transistor to reset the gate electrode of the driving transistor. In the remaining periods after the reset period, in order to prevent leakage of electricity, save power consumption, etc., the voltage value of the reset voltage may be set to be different from the voltage value of the reset voltage in the reset period. The specific voltage value of the reset voltage can be set according to the actual situation, and the present disclosure does not limit this.

For example, the initializing voltage may be a variable voltage, that is, an integrated driving circuit (described below) can output the initializing voltage in a certain range.

The initializing voltage is positively correlated with the second supply voltage, and varies with variance of the second supply voltage, so that the first electrode of the organic light emitting diode can be initialized more accurately, the abnormal light emission of the organic light emitting diode after initialization is avoided, and the display quality is improved. According to the specific operation of the user, the integrated driving circuit can output initializing voltages with different voltage values. For example, in a case where the display panel needs to be brightened, the second supply voltage can increase, and the initializing voltage correspondingly becomes larger, in a case where the display panel needs to be dimmed, the second supply voltage can decrease, and the initializing voltage correspondingly becomes smaller, so as to ensure that the difference between the initializing voltage Vre and the second supply voltage ELVSS is less than the cut-in voltage of the organic light emitting diode OLED, thereby preventing the organic light emitting diode OLED from emitting light in the non-light-emitting period. It should be noted that in a case where the second supply voltage and the initializing voltage change, the change amount of the second supply voltage and the change amount of the initializing voltage are set according to actual conditions, and are not limited in the embodiments of the present disclosure.

For example, in some embodiments, the initializing voltage Vre may range from −8V to 0V, for example, from −6V to 0V. The second supply voltage ELVSS may be in a range of −8V to 1V, for example, in a range of −6V to 0.5V.

For example, in some embodiments, the cut-in voltage of the organic light emitting diode OLED is 0.5V, and in this case, the second supply voltage ELVSS may be −4 V, and the initializing voltage Vre may be −3.6 V, and the initializing voltage Vre may also be −3.7 V, or the like, as long as the difference between the initializing voltage Vre and the second supply voltage ELVSS is less than 0.5 V. In a case where the second supply voltage ELVSS is −4.5 V, in this case, the initializing voltage Vre needs to be changed accordingly, for example, the initializing voltage Vre is −4.1 V, −4.2 V, etc., thereby ensuring that the difference between the initializing voltage Vre and the second supply voltage ELVSS is less than 0.5 V.

For instance, in the pixel circuit 100 provided by the embodiment of the present disclosure, the initializing voltage Vre is less than or equal to the second supply voltage ELVSS. For instance, because the initializing voltage Vre is less than or equal to the second supply voltage ELVSS, the OLED can be in the reverse cut-off state after initialization, so that the abnormal light emission of the OLED after initialization can be avoided, and hence the display quality can be improved. It should be noted that "the initializing voltage Vre is less than or equal to the second supply voltage ELVSS" means that the initializing voltage Vre is numerically less than or equal to the second supply voltage ELVSS in mathematical concepts. For example, if the initializing voltage Vre is −4 V and the second supply voltage ELVSS is −3 V, because −4 is less than −3, the initializing voltage Vre is less than the second supply voltage ELVSS at this time, in this case, the absolute value (that is, 4) of the initializing voltage Vre is greater than the absolute value (that is, 3) of the second supply voltage ELVSS; for another example, if the initializing voltage Vre is 0.1 V and the second supply voltage ELVSS is 0.2 V, because 0.1 is less than 0.2, the initializing voltage Vre is less than the second supply voltage ELVSS at this time, in this case, the absolute value (that is, 0.1) of the initializing voltage Vre is smaller than the absolute value (that is, 0.2) of the second supply voltage ELVSS.

For example, in a case where the initializing voltage Vre is less than or equal to the second supply voltage ELVSS, the absolute value of the difference between the initializing voltage Vre and the second supply voltage ELVSS may be 2V, 3V, or the like.

Figure 3A:
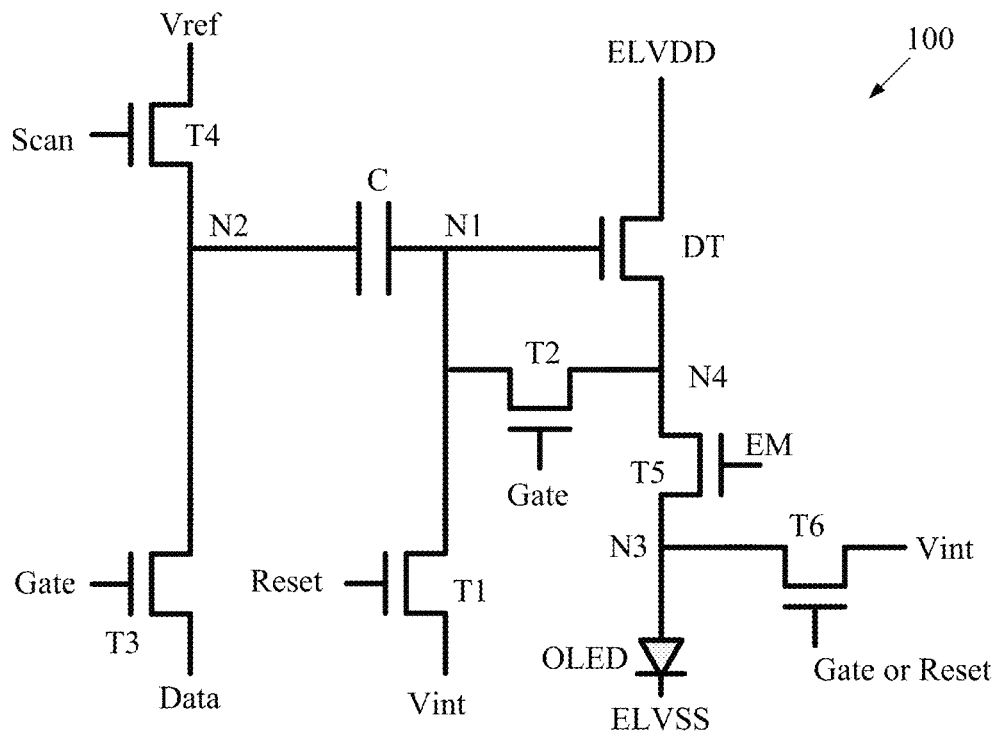
FIG. 3A is a schematic diagram 3 of a pixel circuit provided by the embodiment of the present disclosure.

For instance, as shown in FIG. 3A, in the pixel circuit 100 provided by the embodiment of the present disclosure, the reset circuit 120 includes a first transistor T1; the threshold compensation circuit 130 includes a second transistor T2; the first data write circuit 140 includes a third transistor T3; the reference voltage write circuit 150 includes a fourth transistor T4; the light emitting control circuit 110 includes a fifth transistor T5; and the initializing circuit 160 includes a sixth transistor T6.

For example, a channel length-width ratio of the first transistor T1 is greater than a channel length-width ratio of the third transistor T3.

For example, the channel length-width ratio of the driving transistor DT is in a range of 8 to 13, for example, in some embodiments, the channel length-width ratio of the driving transistor DT is 36.8/3.5, that is, a length of a channel of the driving transistor DT is 36.8 microns (μm), and a width of the channel of the driving transistor DT is 3.5 microns.

For example, a channel length-width ratio of the third transistor T3, a channel length-width ratio of the fourth transistor T4, a channel length-width ratio of the fifth transistor T5, and a channel length-width ratio of the sixth transistor T6 all are in a range of 0.5 to 2.5. For example, in some embodiments, the channel length-width ratio of the third transistor T3 is 3/3, that is, a length of a channel of the third transistor T3 is 3 μm, and a width of the channel of the third transistor T3 is 3 μm; the channel length-width ratio of the fourth transistor T4 is 3/3, that is, a length of a channel of the fourth transistor T4 is 3 μm, and a width of the channel of the fourth transistor T4 is 3 μm; the channel length-width ratio of the fifth transistor T5 is 3/3, that is, a length of a channel of the fifth transistor T5 is 3 μm, and a width of the channel the fifth transistor T5 is 3 μm; the channel length-width ratio of the sixth transistor T6 is 3/2.5, that is, a length of a channel of the sixth transistor T6 is 3 μm, and a width of the channel of the sixth transistor T6 is 2.5 μm.

Figure 3B:
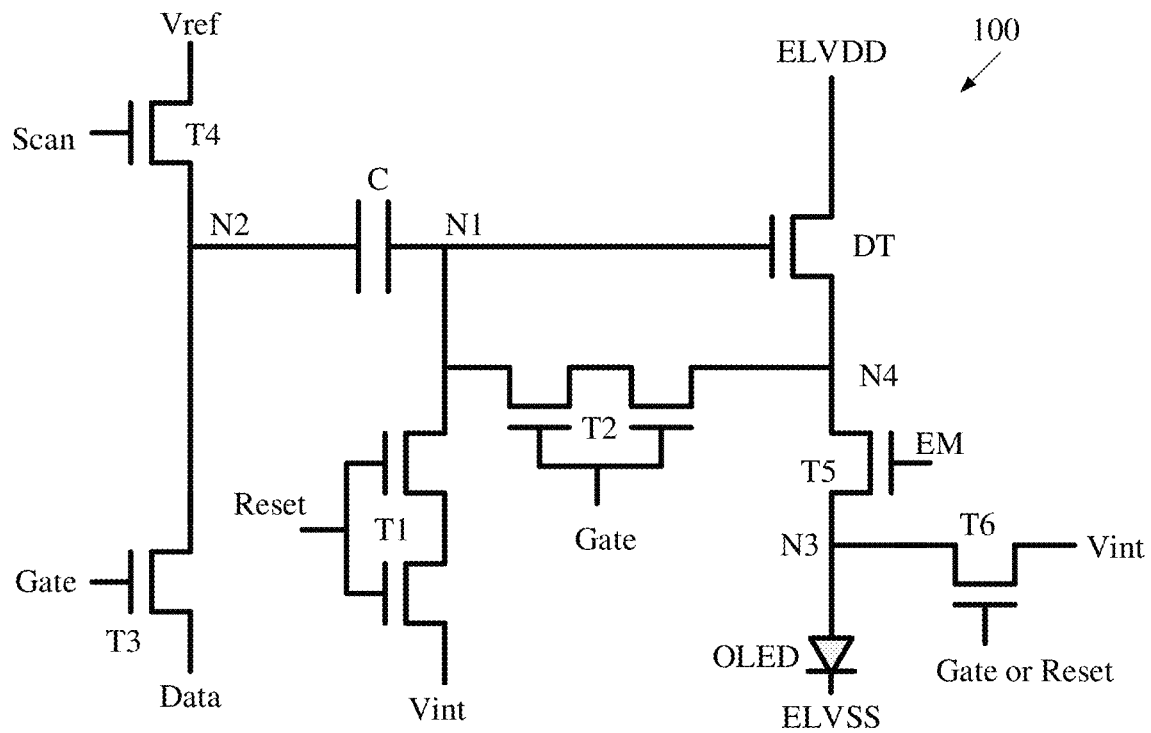
FIG. 3B is a schematic diagram of another pixel circuit provided by the embodiment of the present disclosure.

The pixel circuit shown in FIG. 3B is similar to the pixel circuit shown in FIG. 3A, except that in the pixel circuit shown in FIG. 3B, the first transistor T1 and the second transistor T2 are double-gate transistors, the first transistor T1 comprises a first gate electrode and a second gate electrode, and the second transistor T2 also comprises a first gate electrode and a second gate electrode. The connection mode of the respective transistors and the capacitor in the pixel circuit shown in FIG. 3B is the same as the connection mode of the respective transistors and the capacitor in the pixel circuit shown in FIG. 3A, and the repetition is not described again.

For example, in the example shown in FIG. 3B, the channel length-width ratio of the first transistor T1 ranges from 3 to 7, and the channel length-width ratio of the second transistor T2 ranges from 1 to 3. For example, in some embodiments, the channel length-width ratio of the first transistor T1 is (12−14)/(2−3), for example, is 13.5/2.8, that is, the length of the channel of the first transistor T1 is 12-14 microns, such as 13.5 microns, correspondingly, the length of the channel corresponding to the first gate electrode of the first transistor T1 is 9-13 microns, such as 11 microns, the length of the channel corresponding to the second gate electrode of the first transistor T1 is 2-3 microns, such as 2.5 microns, and the width of the channel of the first transistor T1 is 2-3 microns, such as 2.8 microns. For example, the width of the channel corresponding to the first gate electrode of the first transistor T1 and the width of the channel corresponding to the second gate electrode of the first transistor T1 both are 1-5 microns, such as 2.8 microns. The channel length-width ratio of the second transistor T2 is (4–6)/(2–4), that is, the length of the channel of the second transistor T2 is 4-6 microns, such as 5 microns. For example, the length of the channel corresponding to the first gate electrode of the second transistor T2 is 2-3 microns, such as 2.5 microns, and the length of the channel corresponding to the second gate electrode of the second transistor T2 is 2-3 microns, such as 2.5 microns. For example, the width of the channel of the second transistor T2 is 1-5 microns, such as 3 microns. For example, the width of the channel corresponding to the first gate electrode of the second transistor T2 and the width of the channel corresponding to the second gate electrode of the second transistor T2 both are 1-5 microns, such as 3 microns.

For example, the channel length-width ratio of the driving transistor DT is larger than the channel length-width ratio of any one of the first transistor T1 to the sixth transistor T6.

For example, the length of the channel of the driving transistor DT is greater than the length of the channel of any one of the first transistor T1 to the sixth transistor T6.

Figure 12A:
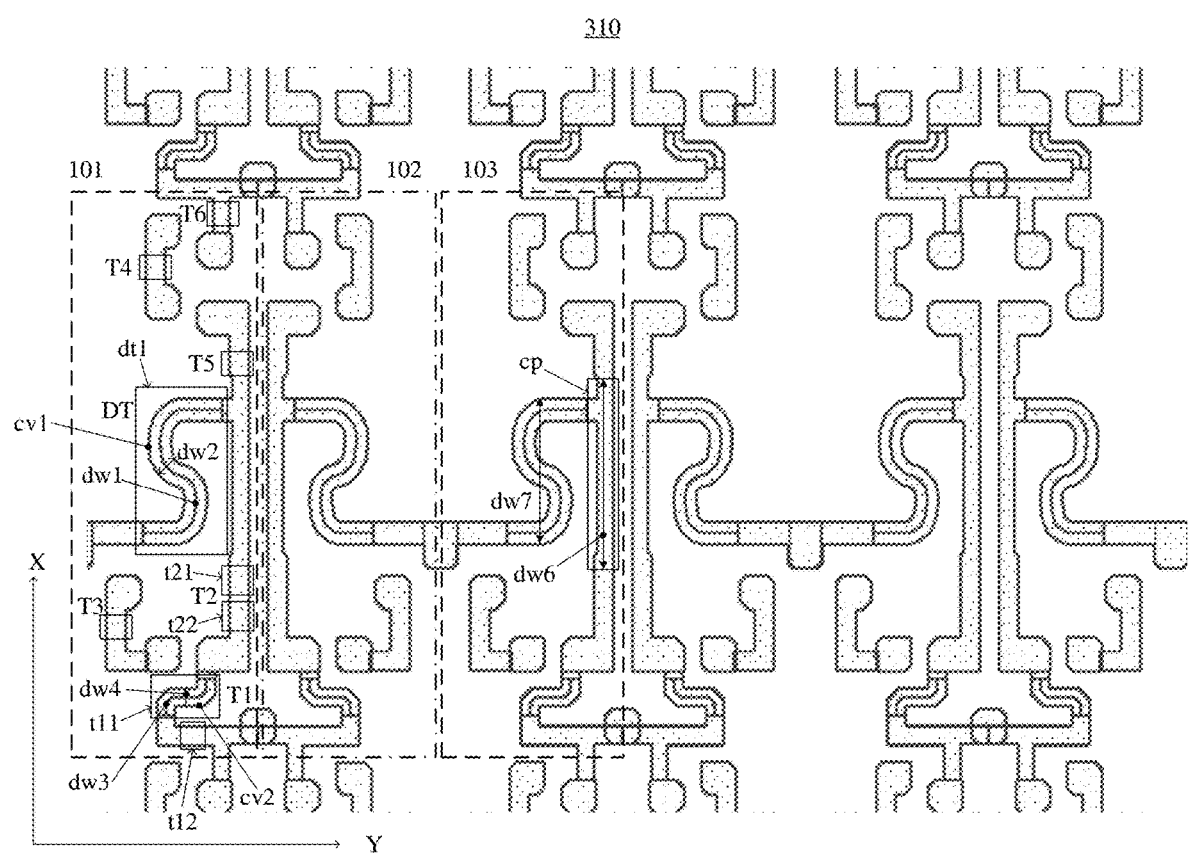
FIG. 12A-12H are schematic structural diagrams of respective layers of a pixel circuit provided by some embodiments of the present disclosure.
Figure 12B:
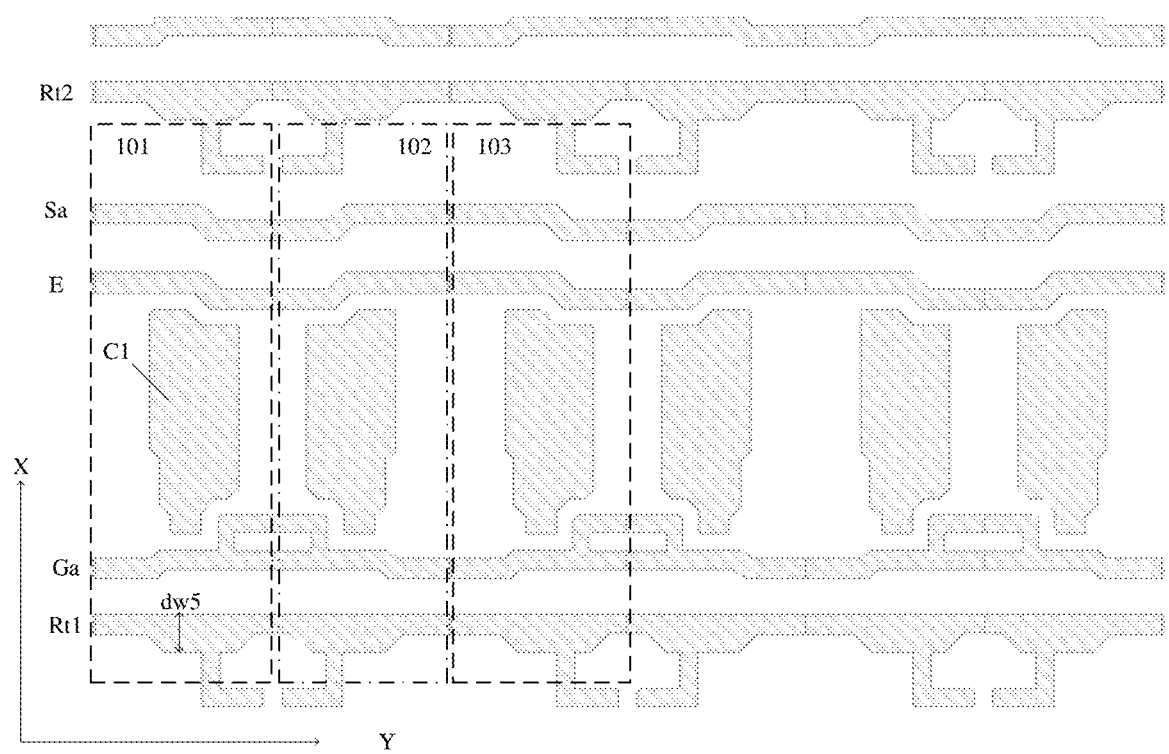

It should be noted that in the embodiment of the present disclosure, the pixel circuit 100 is provided on a base substrate, and the "channel of a transistor" includes a portion of an active layer of the transistor. In a direction perpendicular to the base substrate, the portion of the active layer of the transistor overlaps the gate electrode of the transistor. In some embodiments, as shown in FIGS. 12A to 12B to be described below, gate electrodes of respective transistors may be located in a first conductive layer 320, and active layers of the respective transistors are located in an active semiconductor layer 310, so that the overlapping portions between the active semiconductor layer 310 and the first conductive layer 320 can represent the channels of the respective transistors.

For instance, as shown in FIG. 3A, in the pixel circuit 100 provided by the embodiment of the present disclosure, the gate electrode of the driving transistor DT is electrically connected with the first node N1; a first electrode of the driving transistor DT is electrically connected with a first power line to receive the first supply voltage ELVDD; and a second electrode of the driving transistor DT is electrically connected with a fourth node N4. The first electrode of the organic light-emitting diode OLED is electrically connected with the third node N3, and the second electrode of the organic light-emitting diode OLED is electrically connected with the second power line to receive the second supply voltage ELVSS. The first end of the storage capacitor C is electrically connected with the first node N1, and the second end of the storage capacitor C is electrically connected with the second node N2. A gate electrode of the first transistor T1 is electrically connected with a reset control signal line to receive the reset control signal Reset; a first electrode of the first transistor T1 is electrically connected with a reset voltage line to receive the reset voltage Vint; and a second electrode of the first transistor T1 is electrically connected with the first node N1. A gate electrode of the second transistor T2 is electrically connected with a first scanning signal line to receive the first scanning signal Gate; a first electrode of the second transistor T2 is electrically connected with the first node N1; and a second electrode of the second transistor T2 is electrically connected with the fourth node N4. A gate electrode of the third transistor T3 is electrically connected with the first scanning signal line to receive the first scanning signal Gate; a first electrode of the third transistor T3 is electrically connected with a data signal line to receive the data signal Data; and a second electrode of the third transistor T3 is electrically connected with the second node N2. A gate electrode of the fourth transistor T4 is electrically connected with a second scanning signal line to receive the second scanning signal Scan; a first electrode of the fourth transistor T4 is electrically connected with a reference voltage line to receive reference voltage Vref; and a second electrode of the fourth transistor T4 is electrically connected with the second node N2. A gate electrode of the fifth transistor T5 is electrically connected with a light emitting control signal line to receive the light emitting control signal EM; a first electrode of the fifth transistor T5 is electrically connected with the third node N3; and a second electrode of the fifth transistor T5 is electrically connected with the fourth node N4. A gate electrode of the sixth transistor T6 is electrically connected with the first scanning signal line or the reset control signal line to receive the first scanning signal Gate or the reset control signal Reset; a first electrode of the sixth transistor T6 is electrically connected with the reset voltage line to receive the reset voltage Vint; and a second electrode of the sixth transistor T6 is electrically connected with the third node N3.

It should be noted that, in the examples shown in FIGS. 3A and 3B, the reset voltage line and the initializing voltage line are the same signal line, the connection of the first electrode of the sixth transistor T6 includes but not limited to the case as shown in FIG. 3A in which the first electrode of the sixth transistor T6 is electrically connected with the reset voltage line to receive the reset voltage Vint, for example, the first electrode of the sixth transistor T6 may also be electrically connected with a separately provided initializing voltage line to receive the initializing voltage Vre.

For example, in some embodiments, the reference voltage line and the first electrode of the light emitting element (i.e., the organic light emitting diode OLED) are located in the same layer and formed of the same material, the reference voltage line and the first electrode of the fourth transistor T4 are located in different layers, and the reference voltage line is connected to the first electrode of the fourth transistor T4 through a hole.

For instance, in the pixel circuit 100 provided by the embodiment of the present disclosure, the driving transistor DT, the first transistor T1, the second transistor T2, the third transistor T3, the fourth transistor T4, the fifth transistor T5 and the sixth transistor T6 are all P-type transistors.

For example, the first supply voltage ELVDD ranges from 3V to 8V. For example, in some embodiments, the first supply voltage ELVDD is 4.6V.

For example, the reference voltage Vref ranges from 1V to 8V. For example, in some embodiments, the reference voltage Vref is 3V.

For example, the threshold voltage Vth of the driving transistor ranges from −0.5V to 0.5V.

For example, in some embodiments, the first scanning signal Gate may be in a range of −10V~10V, such as −7V~7V; the reset control signal Reset may also be in a range of −10V~10V, such as −7V~7V. For example, in a specific example, the first scanning signal Gate may be −9V, and the reset control signal Reset is also −9V.

For example, in some embodiments, the reset voltage Vint may range from −5V to −1V, for example, the reset voltage Vint may be −3V, −4V, and so on. The value of the reset voltage Vint is related to the threshold voltage of the driving transistor DT. If threshold voltages of a plurality of driving transistors DT are different, a plurality of reset voltages Vint corresponding to the plurality of driving transistors DT are also different. For example, for a plurality of driving transistors in the same batch or a plurality of driving transistors in different batches, due to process and other reasons, the threshold voltages of the plurality of driving transistors may be different, and the plurality of reset voltages corresponding to the plurality of driving transistors are also different, so that the gate electrode of the driving transistor can be reset more accurately. For example, in a case of setting the reset voltage Vint, first, a base reset voltage (for example, −3V) can be selected, and then a plurality of reference reset voltages (for example, −4V, −3.5V, −2.5V, −2.3V, etc.) can be determined based on the base reset voltage, the base reset voltage and the plurality of reference reset voltages can be input to the gate electrode of the driving transistor, respectively, currents flowing through the driving transistor are detected, and the final value of the reset voltage is determined from the base reset voltage and the plurality of reference reset voltages based on the currents flowing through the driving transistor.

For instance, in the pixel circuit 100 provided by the embodiment of the present disclosure, the driving transistor DT, the first transistor T1, the second transistor T2, the third transistor T3, the fourth transistor T4, the fifth transistor T5 and the sixth transistor T6 are all TFTs, e.g., P-type thin film transistors (TFTs).

It should be noted that all the transistors adopted in the embodiment of the present disclosure may be TFTs, field-effect transistors (FETs) or other switching elements having same characteristics. A source electrode and a drain electrode of the transistor adopted herein may be symmetrical in structure, so the source electrode and the drain electrode of the transistor may have no difference in structure. In the embodiment of the present disclosure, in order to distinguish two electrodes except the gate electrode of the transistor, one electrode is directly described as the first electrode and the other electrode is directly described as the second electrode, so the first electrode and the second electrode of all or partial transistors in the embodiment of the present disclosure may be exchanged as required. For instance, the first electrode of the transistor in the embodiment of the present disclosure may be the source electrode and the second electrode may be the drain electrode; or the first electrode of the transistor is the drain electrode and the second electrode is the source electrode. In addition, the transistors may be divided into N-type transistors and P-type transistors according to the characteristics of the transistors. Description is given with respect to the embodiments of the present disclosure by taking the case that the driving transistor DT, the first transistor T1, the second transistor T2, the third transistor T3, the fourth transistor T4, the fifth transistor T5 and the sixth transistor T6 are all P-type transistors as an example. Examples that the embodiments of the present disclosure adopt N-type transistors or a combination of N-type transistors and P-type transistors may be easily conceived by those skilled in the art without creative efforts on the basis of the description and instruction of the embodiments in the present disclosure, so the examples shall also fall within the scope of protection of the present disclosure.

Figure 4:
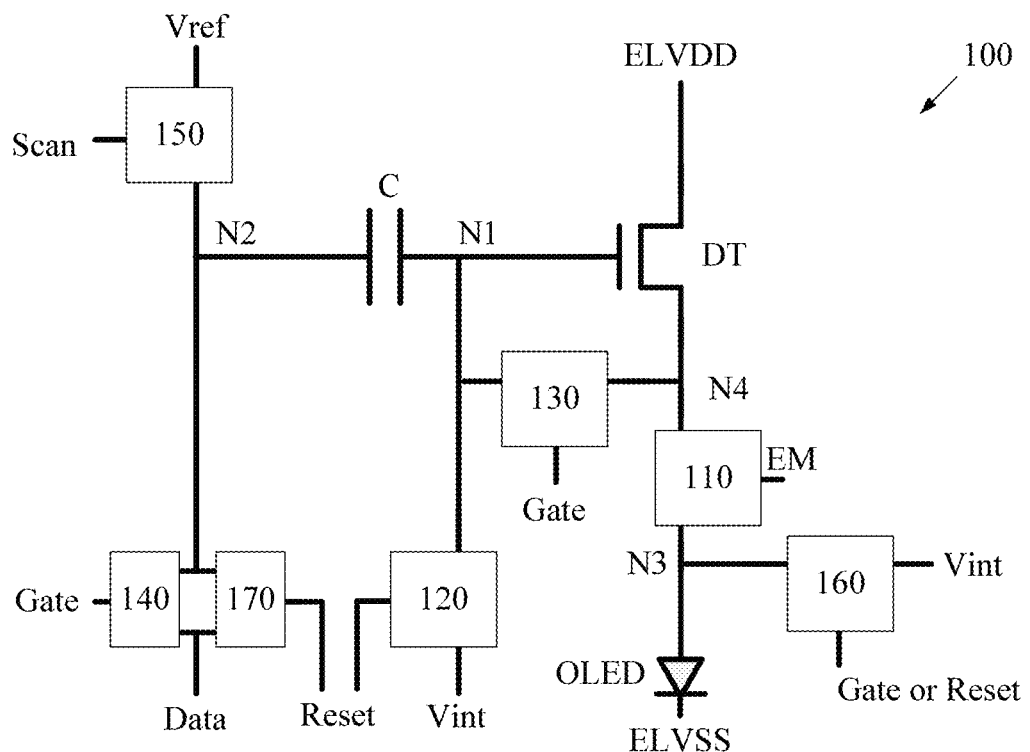
FIG. 4 is a schematic diagram 4 of a pixel circuit provided by the embodiment of the present disclosure.

For instance, as shown in FIG. 4, the pixel circuit 100 provided by the embodiment of the present disclosure further comprises a second data write circuit 170. The second data write circuit 170 is configured to receive the reset control signal Reset and the data signal Data and write the data signal Data into the second node N2 according to the reset control signal Reset.

Figure 5:
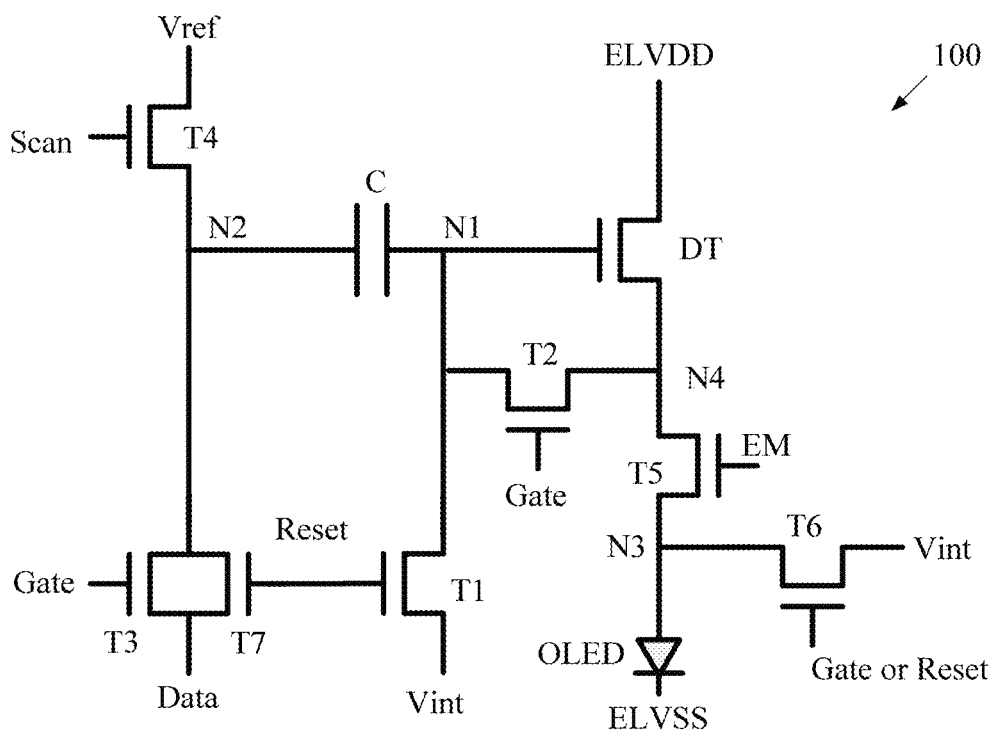
FIG. 5 is a schematic diagram 5 of a pixel circuit provided by the embodiment of the present disclosure.

For instance, as shown in FIG. 5, in the pixel circuit 100 provided by the embodiment of the present disclosure, the reset circuit 120 includes a first transistor T1; the threshold compensation circuit 130 includes a second transistor T2; the first data write circuit 140 includes a third transistor T3; the reference voltage write circuit 150 includes a fourth transistor T4; the light emitting control circuit 110 includes a fifth transistor T5; the initializing circuit 160 includes a sixth transistor T6; and the second data write circuit 170 includes a seventh transistor T7.

For instance, as shown in FIG. 5, in the pixel circuit 100 provided by the embodiment of the present disclosure, a gate electrode of the driving transistor DT is electrically connected with a first node N1; a first electrode of the driving transistor DT is electrically connected with a first power line to receive a first supply voltage ELVDD; and a second electrode of the driving transistor DT is electrically connected with a fourth node N4. A first electrode of the organic light-emitting diode OLED is electrically connected with a third node N3, and a second electrode of the organic light-emitting diode OLED is electrically connected with a second power line to receive a second supply voltage ELVSS. A first end of the storage capacitor C is electrically connected with the first node N1, and a second end of the storage capacitor C is electrically connected with a second node N2. A gate electrode of the first transistor T1 is electrically connected with a reset control signal line to receive a reset control signal Reset; a first electrode of the first transistor T1 is electrically connected with a reset voltage line to receive reset voltage Vint; and a second electrode of the first transistor T1 is electrically connected with the first node N1. A gate electrode of the second transistor T2 is electrically connected with a first scanning signal line to receive a first scanning signal Gate; a first electrode of the second transistor T2 is electrically connected with the first node N1; and a second electrode of the second transistor T2 is electrically connected with the fourth node N4. A gate electrode of the third transistor T3 is electrically connected with the first scanning signal line to receive the first scanning signal Gate; a first electrode of the third transistor T3 is electrically connected with a data signal line to receive a data signal Data; and a second electrode of the third transistor T3 is electrically connected with the second node N2. A gate electrode of the fourth transistor T4 is electrically connected with a second scanning signal line to receive a second scanning signal Scan; a first electrode of the fourth transistor T4 is electrically connected with a reference voltage line to receive reference voltage Vref; and a second electrode of the fourth transistor T4 is electrically connected with the second node N2. A gate electrode of the fifth transistor T5 is electrically connected with a light emitting control signal line to receive a light emitting control signal EM; a first electrode of the fifth transistor T5 is electrically connected with the third node N3; and a second electrode of the fifth transistor T5 is electrically connected with the fourth node N4. A gate electrode of the sixth transistor T6 is electrically connected with the first scanning signal line or the reset control signal line to receive the first scanning signal Gate or the reset control signal Reset; a first electrode of the sixth transistor T6 is electrically connected with the reset voltage line to receive the reset voltage Vint; and a second electrode of the sixth transistor T6 is electrically connected with the third node N3. A gate electrode of the seventh transistor T7 is electrically connected with the reset control signal line to receive the reset control signal Reset; a first electrode of the seventh transistor T7 is electrically connected with the data signal line to receive the data signal Data; and a second electrode of the seventh transistor T7 is electrically connected with the second node N2.

It should be noted that the connection of the first electrode of the sixth transistor T6 includes but not limited to the case as shown in FIG. 5 in which it is electrically connected with the reset voltage line to receive the reset voltage Vint, and the first electrode of the sixth transistor T6 may also be electrically connected with an initializing voltage line to receive the initializing voltage Vre.

For instance, in the pixel circuit 100 provided by the embodiment of the present disclosure, the driving transistor DT, the first transistor T1, the second transistor T2, the third transistor T3, the fourth transistor T4, the fifth transistor T5, the sixth transistor T6 and the seventh transistor T7 are all P-type transistors.

For instance, in the pixel circuit 100 provided by the embodiment of the present disclosure, the driving transistor DT, the first transistor T1, the second transistor T2, the third transistor T3, the fourth transistor T4, the fifth transistor T5, the sixth transistor T6 and the seventh transistor T7 are all TFTs, e.g., P-type thin film transistors (TFTs).

Figure 6:
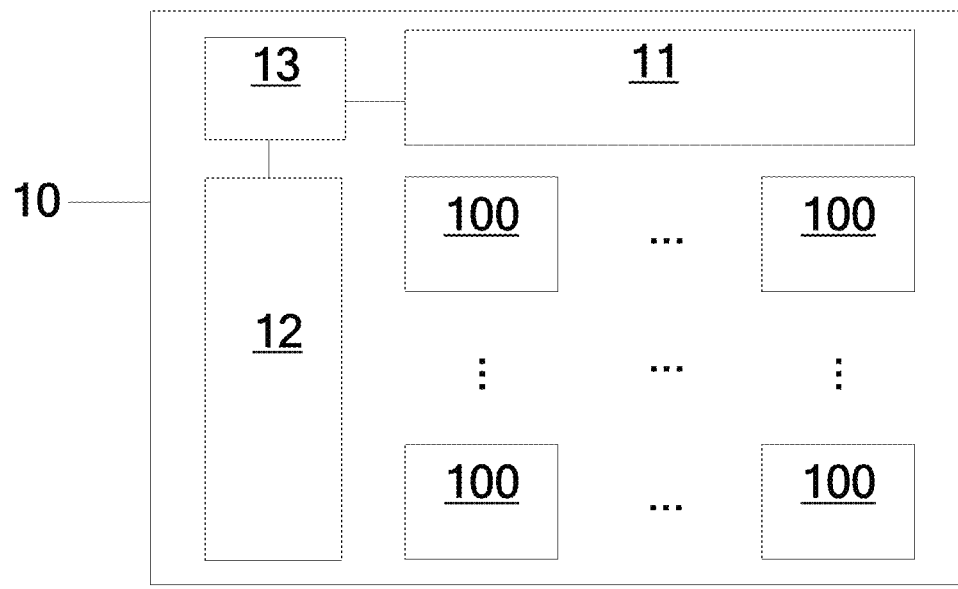
FIG. 6 is a schematic diagram of a display panel provided by the embodiment of the present disclosure.

An embodiment of the present disclosure further provides a display panel 10. As illustrated in FIG. 6, the display panel 10 comprises the pixel circuits 100 provided by any embodiment of the present disclosure.

For instance, the display panel 10 comprises a plurality of pixel circuits 100 arranged in a matrix; each pixel circuit 100 is configured to drive at least one sub-pixel to emit light; and the light emitted by the at least one sub-pixel may be red light, green light, blue light, white light, etc.

For example, the display panel includes a plurality of sub-pixels, the plurality of sub-pixels are arranged in a matrix, and each sub-pixel includes a pixel circuit provided by any embodiment of the present disclosure. The plurality of sub-pixels includes a first sub-pixel and a second sub-pixel, and the first sub-pixel and the second sub-pixel are adjacent. For example, the pixel circuit of the first sub-pixel and the pixel circuit of the second sub-pixel are connected to the same reset voltage line, or the pixel circuit of the first sub-pixel and the pixel circuit of the second sub-pixel are connected to the same first power line.

For example, the plurality of sub-pixels are arranged in N rows and M columns, the first sub-pixel is located in a k-th row of the N rows, and the second sub-pixel is located in a (k+1)-th row of the N rows, where N, M, and k are positive integers, and k is less than N. An initializing circuit in the pixel circuit of the first sub-pixel and a reset circuit in the pixel circuit of the second sub-pixel are controlled by the same reset control signal line; the initializing circuit in the pixel circuit of the first sub-pixel and a reset circuit in the pixel circuit of the first sub-pixel are controlled by different reset control signal lines; that is, in the display panel, an initializing circuit in a pixel circuit of a sub-pixel in a current row and a reset circuit in a pixel circuit of a sub-pixel in a next row adjacent to the current row are controlled by the same reset control signal line, and the reset circuit in the pixel circuit of the sub-pixel in the current row and an initializing circuit in a pixel circuit of a sub-pixel in a previous row adjacent to the current row are controlled by the same reset control signal line, in addition, the initializing circuit and the reset circuit in the pixel circuit of the sub-pixel in the current row are controlled by different reset control signal lines, respectively.

For example, in some embodiments, the display panel further includes: an integrated driving circuit.

The integrated driving circuit comprises a second supply voltage output sub-circuit and an initializing voltage output sub-circuit, the second supply voltage output sub-circuit is configured to output a second supply voltage, and the initializing voltage output sub-circuit is configured to output the initializing voltage. The light emitting element further comprises a second electrode, the second electrode of the light emitting element is configured to receive the second supply voltage.

The second supply voltage output sub-circuit is coupled to the initializing voltage output sub-circuit, and the initializing voltage output sub-circuit is configured to receive the second supply voltage and adjust the initializing voltage according to the second supply voltage, thereby making the initializing voltage change with the second supply voltage.

For instance, as shown in FIG. 6, the display panel 10 provided by the embodiment of the present disclosure further comprises: a data driver 11, a scan driver 12, and a controller 13. The data driver 11 is configured to provide the data signal Data for the pixel circuit 100 according to an instruction of the controller 13. The scan driver 12 is configured to provide the light emitting control signal EM, the first scanning signal Gate, the second scanning signal Scan, the reset control signal Reset and the like for the pixel circuit 100 according to the instruction of the controller 13.

For example, the scan driver 12 may include a GOA (gate driver on array) circuit. The first scanning signal line for providing the first scanning signal may be connected to the GOA circuit, and the GOA circuit is used to provide the first scanning signal line with a voltage ranging from −10V to 10V, for example. The reset control signal line used for providing the reset control signal may also be connected to the GOA circuit, and the GOA circuit is used to provide the reset control signal line with a voltage ranging from −10V to 10V, for example.

For example, the GOA circuit may be provided in a peripheral area of the display panel 10.

For instance, the integrated driving circuit, the data driver 11, the scan driver 12 and the controller 13 may be respectively implemented by an application-specific integrated circuit (ASIC) chip and may also be implemented by a circuit or software, hardware (circuit), firmware or any combination thereof. For instance, the scan driver 12 may be implemented by a gate on array (GOA) circuit.

Moreover, for instance, the integrated driving circuit, the data driver 11, the scan driver 12 and the controller 13 may be realized by a processor and a memory. In the embodiment of the present disclosure, the processor may process data signals and may include a variety of computational structures, e.g., a complex instruction set computer (CISC) structure, a reduced instruction set computing (RISC) structure or a structure that incorporates a plurality of instruction set combinations. In some embodiments, the processor may also be a microprocessor, e.g., an X86 processor or an ARM processor, and may also be a digital signal processor (DSP), etc. The processor may control other components to execute desired functions. In the embodiment of the present disclosure, the memory may store instructions and/or data executed by the processor. For instance, the memory may include one or more computer program products. The computer program products may include various kinds of computer readable storage media, e.g., volatile memory and/or nonvolatile memory. The volatile memory, for instance, include a random access memory (RAM) and/or a cache memory. The nonvolatile memory, for instance, may include a read-only memory (ROM), a hard disk, a flash memory, etc. One or more computer program instructions may be stored in the computer readable storage medium. The processor may execute the program instructions to realize the desired functions (implemented by the processor) in the embodiment of the present disclosure. Various applications and various data, e.g., data used and/or produced by the applications, may also be stored in the computer readable storage media.

For instance, the display panel 10 further comprises data signal lines, light emitting control signal lines, first scanning signal lines, second scanning signal lines and reset control signal lines (not shown in FIG. 6). The data driver 11 provides the data signal Data for the pixel circuits 100 through the data signal lines. The scan driver 12 respectively provides the light emitting control signal EM, the first scanning signal Gate, the second scanning signal Scan and the reset control signal Reset to each of the pixel circuits 100 through the light emitting control signal line, the first scanning signal line, the second scanning signal line, and the reset control signal line.

For instance, the display panel 10 further comprises a power supply (a voltage source or a current source, not shown in the figure), first power lines, second power lines, reference voltage lines, and reset voltage lines (not shown in FIG. 6). The power supply is configured to respectively provide the first supply voltage ELVDD, the second supply voltage ELVSS, the reference voltage Vref, and the reset voltage Vint for the pixel circuits 100 through the first power lines, the second power lines, the reference voltage lines, and the reset voltage lines.

Figure 7:
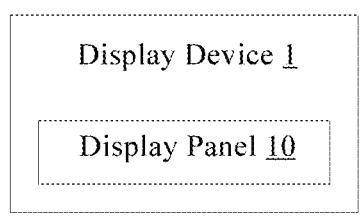
FIG. 7 is a schematic diagram of a display device provided by the embodiment of the present disclosure.

An embodiment of the present disclosure further provides a display device. As illustrated in FIG. 7, the display device 1 comprises the display panel 10 provided by any embodiment of the present disclosure.

For instance, the display device provided by an embodiment of the present disclosure may be any product or component with display function such as a mobile phone, a tablet PC, a TV, a display, a notebook computer, a digital picture frame and a navigator.

It should be noted that the display device 1 may include the display panel 10, and may also include various terminal devices.

Figure 8:
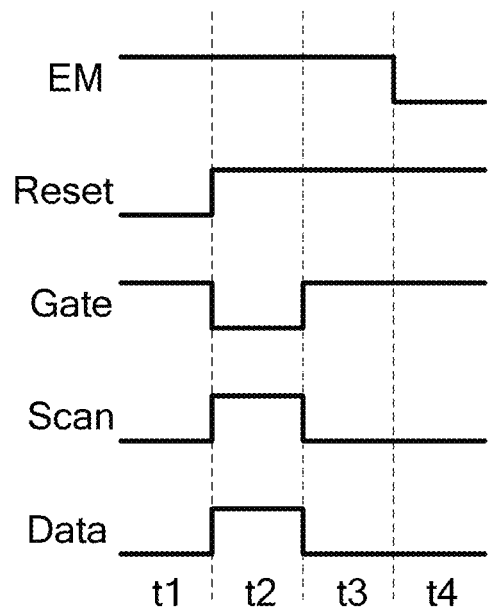
FIGS. 8 and 9 are illustrative drive timing diagrams of the pixel circuit as shown in FIG. 3A provided by the embodiment of the present disclosure.

An embodiment of the present disclosure further provides a driving method of the pixel circuit 100 as shown in FIG. 3A. For instance, as shown in FIG. 8, the driving method comprises a reset period t1, a data write and threshold compensation period t2, a voltage drop compensation period t3, and an emission period t4 within the display period of one frame.

In the reset period t1, the light emitting control signal EM is set to be a turn-off voltage; the reset control signal Reset is set to be a turn-on voltage; the first scanning signal Gate is set to be a turn-off voltage; the second scanning signal Scan is set to be a turn-on voltage; and the data signal Data is set to be an ineffective data signal.

In the data write and threshold compensation period t2, the light emitting control signal EM is set to be a turn-off voltage; the reset control signal Reset is set to be a turn-off voltage; the first scanning signal Gate is set to be a turn-on voltage; the second scanning signal Scan is set to be a turn-off voltage; and the data signal Data is set to be an effective data signal.

In the voltage drop compensation period t3, the light emitting control signal EM is set to be a turn-off voltage; the reset control signal Reset is set to be a turn-off voltage; the first scanning signal Gate is set to be a turn-off voltage; the second scanning signal Scan is set to be a turn-on voltage; and the data signal Data is set to be an ineffective data signal.

In the emission period t4, the light emitting control signal EM is set to be a turn-on voltage; the reset control signal Reset is set to be a turn-off voltage; the first scanning signal Gate is set to be a turn-off voltage; the second scanning signal Scan is set to be a turn-on voltage; and the data signal Data is set to be an ineffective data signal.

For example, as shown in FIG. 8, during the display period of one frame, the data write and threshold compensation period t2 and the emission period t4 do not overlap in time, that is, in a case where the driving transistor drives the light emitting element to emit light, the operations in the data write and threshold compensation period t2 have ended, as shown in FIG. 3A, that is, in the same pixel circuit, the second transistor T2 and the fifth transistor T5 are not simultaneously turned on, and the third transistor T3 and the fifth transistor T5 are not simultaneously turned on.

For instance, the turn-on voltage in the embodiments of the present disclosure refers to the voltage capable of switching on the connection between the first electrode and the second electrode of a corresponding transistor, and the turn-off voltage refers to the voltage capable of switching off the first electrode and the second electrode of the corresponding transistor. When the transistors are P-type transistors, the turn-on voltage is a low voltage (e.g., 0V) and the turn-off voltage is a high voltage (e.g., 5V); and when the transistors are N-type transistors, the turn-on voltage is a high voltage (e.g., 5V) and the turn-off voltage is a low voltage (e.g., 0V). Description is given to the drive waveform as shown in FIGS. 8 to 11 by taking the P-type transistors for example, namely the turn-on voltage is a low voltage (e.g., 0V) and the turn-off voltage is a high voltage (e.g., 5V). The ineffective data signal is, for instance, a low voltage signal (e.g., 0V), and the effective data signal is, for instance, a signal including luminescent data information, and is described in FIGS. 8 to 11 by taking a high voltage signal as an example.

For instance, as shown in FIGS. 3A and 8, in the reset period t1, the light emitting control signal EM is a turn-off voltage; the reset control signal Reset is a turn-on voltage; the first scanning signal Gate is a turn-off voltage; the second scanning signal Scan is a turn-on voltage; and the data signal Data is an ineffective data signal. At this point, the first transistor T1 and the fourth transistor T4 are in the on-state, and the second transistor T2, the third transistor T3 and the fifth transistor T5 are in the off-state. The reset voltage Vint is transmitted to the first node N1 by the first transistor T1, and the reference voltage Vref is transmitted to the second node N2 by the fourth transistor T4. That is to say, the reset circuit receives the reset control signal Reset and writes the reset voltage Vint into the first node N1 according to the reset control signal Reset; and the reference voltage write circuit receives the second scanning signal Scan and writes the reference voltage Vref into the second node N2 according to the second scanning signal Scan.

In the data write and threshold compensation period t2, the light emitting control signal EM is a turn-off voltage; the reset control signal Reset is a turn-off voltage; the first scanning signal Gate is a turn-on voltage; the second scanning signal Scan is a turn-off voltage; and the data signal Data is an effective data signal. At this point, the second transistor T2 and the third transistor T3 are in the on-state, and the first transistor T1, the fourth transistor T4 and the fifth transistor T5 are in the off-state. At this point, the voltage Vdata of the effective data signal is transmitted to the second node N2 by the third transistor T3, and the voltage of the second node N2 is converted to Vdata from Vref in the reset period t1, namely the first data write circuit receives the first scanning signal Gate and the data signal Data and writes the data signal Data into the second node N2 according to the first scanning signal Gate. The second transistor T2 is switched on and connected with the driving transistor DT to form a diode structure, and the voltage of the first node N1 is ELVDD+Vth, in which ELVDD is the first supply voltage and Vth is the threshold voltage of the driving transistor, namely the threshold compensation circuit receives the first scanning signal Gate and performs threshold voltage compensation against the voltage of the first node N1 according to the first scanning signal Gate. In this period, the voltage at both ends of the storage capacitor C is ELVDD+Vth−Vdata.

In the voltage drop compensation period t3, the light emitting control signal EM is a turn-off voltage; the reset control signal Reset is a turn-off voltage; the first scanning signal Gate is a turn-off voltage; the second scanning signal Scan is a turn-on voltage; and the data signal Data is an ineffective data signal. The fourth transistor T4 is in the on-state, and the first transistor T1, the second transistor T2, the third transistor T3 and the fifth transistor T5 are in the off-state. At this point, the reference voltage Vref is transmitted to the second node N2 by the fourth transistor T4 again. Due to the bootstrap function of the storage capacitor C (namely the voltage at both ends of the storage capacitor will not have sudden change), the voltage of the first node N1 is converted into ELVDD+Vth−Vdata+Vref.

In the emission period t4, the light emitting control signal EM is a turn-on voltage; the reset control signal Reset is a turn-off voltage; the first scanning signal Gate is a turn-off voltage; the second scanning signal Scan is a turn-on voltage; and the data signal Data is an ineffective data signal. The fourth transistor T4 and the fifth transistor T5 are in the on-state, and the first transistor T1, the second transistor T2 and the third transistor T3 are in the off-state. The voltage of the first node N1 is kept to be ELVDD+Vth−Vdata+Vref; the luminous current $I_{oled}$ flows into the organic light-emitting diode OLED through the driving transistor DT and the fifth transistor T5; and the organic light-emitting diode OLED emits light. That is to say, the light emitting control circuit receives the light emitting control signal EM and controls the organic light-emitting diode OLED to emit light according to the light emitting control signal EM. The luminous current $I_{oled}$ satisfies the following saturation current formula:

$$K(Vgs-Vth)^2 = K(ELVDD+Vth-Vdata+Vref-ELVDD-Vth)^2 = K(Vref-Vdata)^2$$

wherein $$K = 0.5\mu_n Cox \frac{W}{L};$$

$\mu_n$ refers to me channel mobility of the driving transistor; Cox refers to the channel capacitance per unit area of the driving transistor; W and L respectively refer to the channel width and the channel length of the driving transistor; and Vgs refers to the gate source voltage of the driving transistor (the difference between the gate voltage and the source voltage of the driving transistor).

As can be seen from the above formula, the current flowing across the OLED is irrelevant to the threshold voltage of the driving transistor DT and is also irrelevant to the voltage ELVDD any more. Therefore, the pixel circuit well compensates the threshold voltage of the driving transistor DT and the IR drop on the ELVDD wiring.

For instance, when the gate electrode of the sixth transistor T6 is electrically connected with the first scanning signal line to receive the first scanning signal Gate, in the data write and threshold compensation period t2, the sixth transistor T6 is in the on-state, and the potential of the third node N3 is at the initializing voltage Vre (for instance, the initializing voltage Vre is equal to the reset voltage Vint). For instance, the difference between the initializing voltage Vre and the second supply voltage ELVSS is less than the cut-in voltage of the organic light-emitting diode OLED. Moreover, for instance, the initializing voltage Vre is less than or equal to the second supply voltage ELVSS. Thus, the abnormal light emission of the OLED can be avoided, and hence the display quality can be improved. In the emission period t4, the sixth transistor T6 is in the off-state. In the process of displaying a black image, the voltage of the third node N3 may be affected by flowing out of the leakage current of the sixth transistor T6. Therefore, the low brightness in the case of black image is guaranteed, and the display effect is improved.

For instance, when the gate electrode of the sixth transistor T6 is electrically connected with the reset control signal line to receive the reset control signal Reset, in the reset period t1, the sixth transistor T6 is in the on-state, and the potential of the third node N3 is at the initializing voltage Vre (for instance, the initializing voltage Vre is equal to the reset voltage Vint). For instance, the difference between the initializing voltage Vre and the second supply voltage ELVSS is less than the cut-in voltage of the organic light-emitting diode OLED. Moreover, for instance, the initializing voltage Vre is less than or equal to the second supply voltage ELVSS. Thus, the abnormal light emission of the OLED can be avoided, and hence the display quality can be improved. In the emission period t4, the sixth transistor T6 is in the off-state. In the case of displaying a black image, the voltage of the third node N3 may be affected by flowing out of the leakage current of the sixth transistor T6. Therefore, the low brightness in the case of black image is guaranteed, and the display effect is improved.

For instance, as described above, the initializing circuit receives the first scanning signal Gate or the reset control signal Reset and writes the initializing voltage Vre into the third node N3 according to the first scanning signal Gate or the reset control signal Reset. The initializing voltage Vre is, for instance, equal to the reset voltage Vint.

For instance, in the driving method provided by the embodiment of the present disclosure, the ratio of the duration of the emission period t4 to the display period of one frame F is adjustable. Thus, the luminous brightness may be controlled by adjustment of the ratio of the duration of the emission period t4 to the display period of one frame F.

For instance, the ratio of the duration of the emission period t4 to the display period of one frame F is adjusted by control of the scan driver 12 in the display panel.

Figure 9:
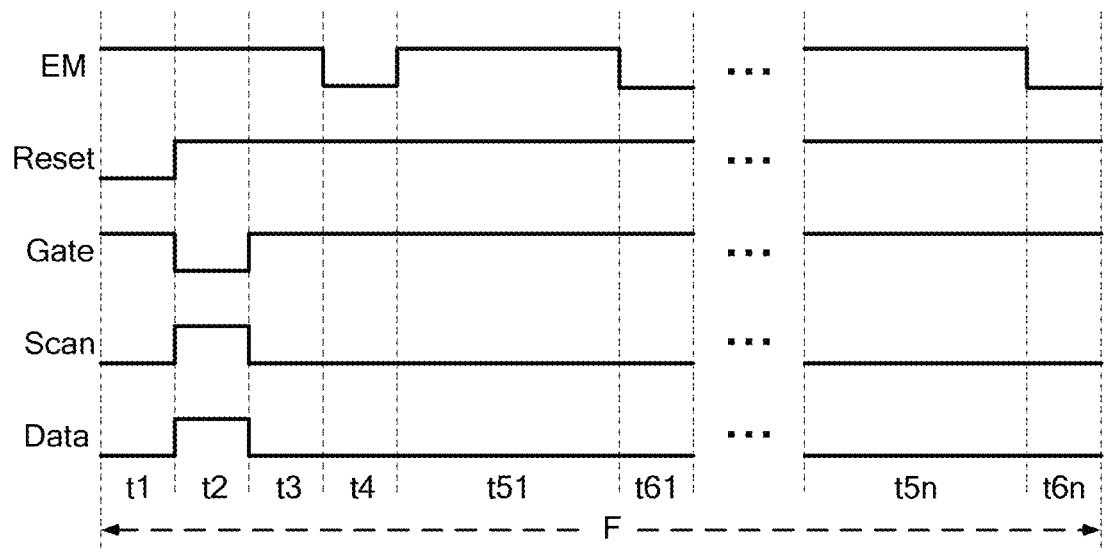

For instance, as shown in FIG. 9, the driving method provided by the embodiment of the present disclosure further comprises an emission continuation period within the display period of one frame F. The emission continuation period includes at least one shutdown sub-period and at least one emission sub-period. For instance, the emission continuation period includes n shutdown sub-periods (t51 ... t5n) and n emission sub-periods (t61 ... t6n). In the shutdown sub-period, the light emitting control signal EM is set to be a turn-off voltage; the reset control signal Reset is set to be a turn-off voltage; the first scanning signal Gate is set to be a turn-off voltage; the second scanning signal Scan is set to be a turn-on voltage; and the data signal Data is set to be an ineffective data signal. In the emission sub-period, the light emitting control signal EM is set to be a turn-on voltage; the reset control signal Reset is set to be a turn-off voltage; the first scanning signal Gate is set to be a turn-off voltage; the second scanning signal Scan is set to be a turn-on voltage; and the data signal Data is set to be an ineffective data signal. The setting allows the OLED to switch between luminous state and non-luminous state for multiple times within the display period of one frame, increases the luminous frequency of the OLED, and reduces or avoids the flicker phenomenon caused by visual retention.

For instance, the flicker phenomenon can be well improved when three shutdown sub-periods and three emission sub-periods are included within the display period of one frame, namely n=3.

For instance, in the driving method provided by the embodiment of the present disclosure, the ratio of the sum of the duration of the emission period t4 and the total duration of all the emission sub-periods to the display period of one frame F is adjustable.

For instance, in the driving method provided by the embodiment of the present disclosure, the duration of each shutdown sub-period is equal to the sum of the duration of the reset period t1, the duration of the data write and threshold compensation period t2, and the duration of the voltage drop compensation period t3; and the duration of each emission sub-period is equal to the duration of the emission period t4. This setting can ensure the same luminous duration of the OLED each time and equal interval between emission periods, simplify timing control, and ensure the stability of circuits.

An embodiment of the present disclosure further provides a driving method of the pixel circuit 100 as shown in FIG. 5, which comprises a reset period t1, a data write and threshold compensation period t2, a voltage drop compensation period t3 and an emission period t4 within the display period of one frame.

In the reset period t1, the light emitting control signal EM is set to be a turn-off voltage; the reset control signal Reset is set to be a turn-on voltage; the first scanning signal Gate is set to be a turn-off voltage; the second scanning signal Scan is set to be a turn-off voltage; and the data signal Data is set to be an effective data signal.

In the data write and threshold compensation period t2, the light emitting control signal EM is set to be a turn-off voltage; the reset control signal Reset is set to be a turn-off voltage; the first scanning signal Gate is set to be a turn-on voltage; the second scanning signal Scan is set to be a turn-off voltage; and the data signal Data is set to be an effective data signal.

In the voltage drop compensation period t3, the light emitting control signal EM is set to be a turn-off voltage; the reset control signal Reset is set to be a turn-off voltage; the first scanning signal Gate is set to be a turn-off voltage; the second scanning signal Scan is set to be a turn-on voltage; and the data signal Data is set to be an ineffective data signal.

In the emission period t4, the light emitting control signal EM is set to be a turn-on voltage; the reset control signal Reset is set to be a turn-off voltage; the first scanning signal Gate is set to be a turn-off voltage; the second scanning signal Scan is set to be a turn-on voltage; and the data signal Data is set to be an ineffective data signal.

Figure 10:
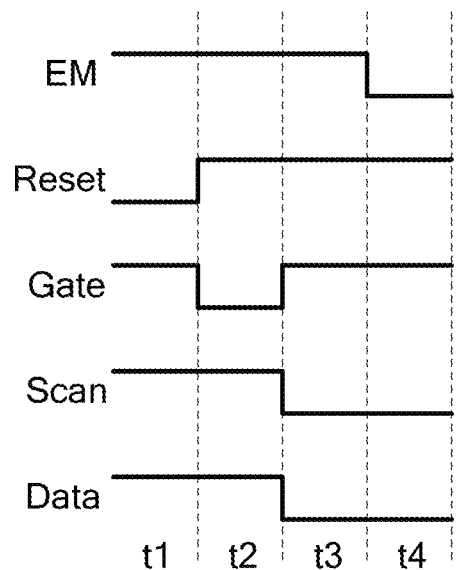
FIGS. 10 and 11 are illustrative drive timing diagrams of the pixel circuit as shown in FIG. 5 provided by the embodiment of the present disclosure.

For instance, as shown in FIGS. 5 and 10, in the reset period t1, the light emitting control signal EM is a turn-off voltage; the reset control signal Reset is a turn-on voltage; the first scanning signal Gate is a turn-off voltage; the second scanning signal Scan is a turn-off voltage; and the data signal Data is an effective data signal. At this point, the first transistor T1 and the seventh transistor T7 are in the on-state, and the second transistor T2, the third transistor T3, the fourth transistor T4 and the fifth transistor T5 are in the off-state. The reset voltage Vint is transmitted to the first node N1 by the first transistor T1, and the voltage Vdata of the effective data signal is transmitted to the second node N2 by the seventh transistor T7. That is to say, the reset circuit receives the reset control signal Reset and writes the reset voltage Vint into the first node N1 according to the reset control signal Reset; and the second data write circuit receives the reset control signal Reset and the data signal Data and writes the data signal Data into the second node N2 according to the reset control signal Reset.

In the data write and threshold compensation period t2, the light emitting control signal EM is a turn-off voltage; the reset control signal Reset is a turn-off voltage; the first scanning signal Gate is a turn-on voltage; the second scanning signal Scan is a turn-off voltage; and the data signal Data is an effective data signal. At this point, the second transistor T2 and the third transistor T3 are in the on-state, and the first transistor T1, the fourth transistor T4, the fifth transistor T5 and the seventh transistor T7 are in the off-state. At this point, the voltage Vdata of the effective data signal is transmitted to the second node N2 by the third transistor T3 again. That is to say, the first data write circuit receives the first scanning signal Gate and the data signal Data and writes the data signal Data into the second node N2 according to the first scanning signal Gate. The second transistor T2 is switched on and connected with the driving transistor DT to form a diode structure, and the voltage of the first node N1 is ELVDD+Vth, in which ELVDD is the first supply voltage and Vth is the threshold voltage of the driving transistor. That is to say, the threshold compensation circuit receives the first scanning signal Gate and writes the compensating voltage into the first node N1 according to the first scanning signal Gate, and the compensating voltage is ELVDD+Vth, i.e., the sum of the first supply voltage ELVDD and the threshold voltage Vth of the driving transistor. For instance, in this period, the voltage difference between two ends of the storage capacitor C is ELVDD+Vth−Vdata.

In the voltage drop compensation period t4, the light emitting control signal EM is a turn-off voltage; the reset control signal Reset is a turn-off voltage; the first scanning signal Gate is a turn-off voltage; the second scanning signal Scan is a turn-on voltage; and the data signal Data is an ineffective data signal. The fourth transistor T4 is in the on-state, and the first transistor T1, the second transistor T2, the third transistor T3, the fifth transistor T5 and the seventh transistor T7 are in the off-state. At this point, the reference voltage Vref is transmitted to the second node N2 by the fourth transistor T4 again. Due to the bootstrap function of the storage capacitor C (namely the voltage at both ends of the storage capacitor will not have sudden change), the voltage of the first node N1 is converted into ELVDD+Vth−Vdata+Vref.

In the emission period t4, the light emitting control signal EM is a turn-on voltage; the reset control signal Reset is a turn-off voltage; the first scanning signal Gate is a turn-off voltage; the second scanning signal Scan is a turn-on voltage; and the data signal Data is an ineffective data signal.

The fourth transistor T4, the fifth transistor T5 and the seventh transistor T7 are in the on-state, and the first transistor T1, the second transistor T2 and the third transistor T3 are in the off-state. The voltage of the first node N1 is kept to be ELVDD+Vth−Vdata+Vref; the luminous current Ioled flows into the organic light-emitting diode OLED through the driving transistor DT and the fifth transistor T5; and the organic light-emitting diode OLED emits light. That is to say, the light emitting control circuit receives the light emitting control signal EM and controls the organic light-emitting diode OLED to emit light according to the light emitting control signal EM. The luminous current Ioled satisfies the following saturation current formula:

$$K(Vgs-Vth)^2 = K(ELVDD+Vth-Vdata+Vref-ELVDD-Vth)^2 = K(Vref-Vdata)^2$$

wherein $$K = 0.5\mu_n Cox \frac{W}{L};$$

$\mu_n$ refers to the channel mobility of the driving transistor; Cox refers to the channel capacitance per unit area of the driving transistor; W and L respectively refer to the channel width and the channel length of the driving transistor; and Vgs refers to the gate source voltage of the driving transistor (the difference between the gate voltage and the source voltage of the driving transistor).

As can be seen from the above formula, the current flowing across the OLED is irrelevant to the threshold voltage of the driving transistor DT and is also irrelevant to the voltage ELVDD any more. Therefore, the pixel circuit well compensates the threshold voltage of the driving transistor DT and the IR drop on the ELVDD wiring.

For instance, compared with the driving method of the drive circuit as shown in FIG. 3A, the driving method of the drive circuit as shown in FIG. 5 begins to write the data signal into the second node N2 in the reset period t1, increases the data signal write time, meanwhile, avoids the impact of overlarge voltage change of the second node N2 on the circuit when the reset period t1 is converted into the data write and threshold compensation period t2, and hence is favorable for the stability of the circuit.

For instance, when the gate electrode of the sixth transistor T6 is electrically connected with the first scanning signal line to receive the first scanning signal Gate, in the data write and threshold compensation period t2, the sixth transistor T6 is in the on-state, and the potential of the third node N3 is the initializing voltage Vre (for instance, the initializing voltage Vre is equal to the reset voltage Vint). For instance, the difference between the initializing voltage Vre and the second supply voltage ELVSS is less than the cut-in voltage of the organic light-emitting diode OLED. Moreover, for instance, the initializing voltage Vre is less than or equal to the second supply voltage ELVSS. Thus, the abnormal light emission of the OLED can be avoided, and hence the display quality can be improved. In the emission period t4, the sixth transistor T6 is in the off-state. In the process of displaying a black image, the voltage of the third node N3 may be affected by flowing out of the leakage current of the sixth transistor T6. Therefore, the low brightness in the case of black image is guaranteed, and the display effect is improved.

For instance, when the gate electrode of the sixth transistor T6 is electrically connected with the reset control signal line to receive the reset control signal Reset, in the reset period t1, the sixth transistor T6 is in the on-state, and the potential of the third node N3 is at the initializing voltage Vre (for instance, the initializing voltage Vre is equal to the reset voltage Vint). For instance, the difference between the initializing voltage Vre and the second supply voltage ELVSS is less than the cut-in voltage of the organic light-emitting diode OLED. Moreover, for instance, the initializing voltage Vre is less than or equal to the second supply voltage ELVSS. Thus, the abnormal light emission of the OLED can be avoided, and hence the display quality can be improved. In the emission period t4, the sixth transistor T6 is in the off-state. In the case of displaying a black image, the voltage of the third node N3 may flow out through the leakage current of the sixth transistor T6. Therefore, the low brightness in the case of black image is guaranteed, and the display effect is improved.

For instance, as described above, the initializing circuit receives the first scanning signal Gate or the reset control signal Reset and writes the initializing voltage Vre into the third node N3 according to the first scanning signal Gate or the reset control signal Reset. The initializing voltage Vre is, for instance, equal to the reset voltage Vint.

For instance, in the driving method provided by the embodiment of the present disclosure, the ratio of the duration of the emission period t4 to the display period of one frame F is adjustable. Thus, the luminous brightness may be controlled by adjustment of the ratio of the duration of the emission period t4 to the display period of one frame F.

For instance, the ratio of the duration of the emission period t4 to the display period of one frame F is adjusted by control of the scan driver 12 in the display panel.

Figure 11:
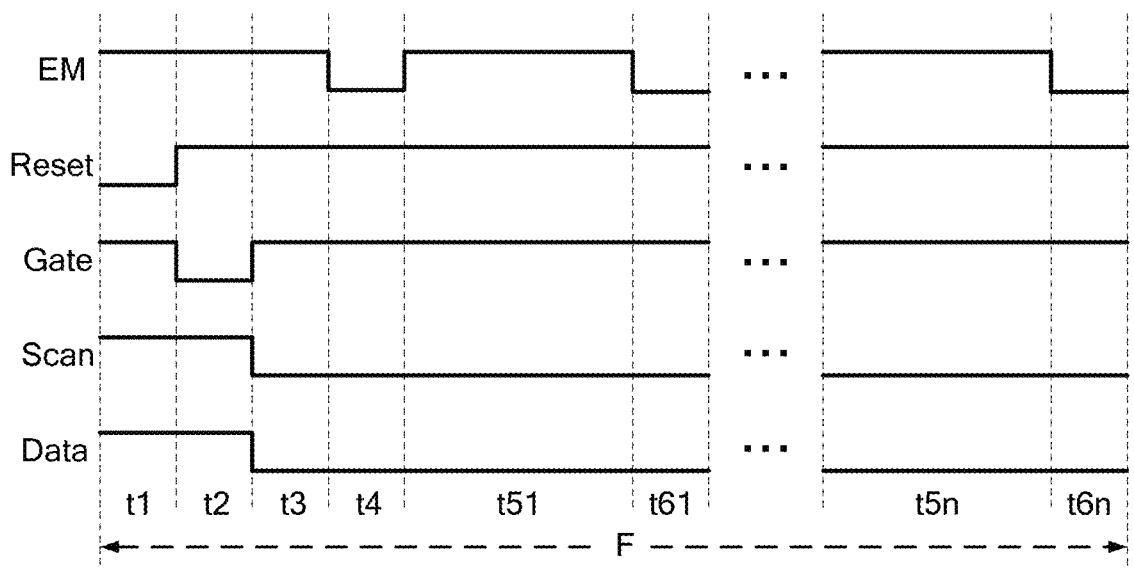

For instance, as shown in FIG. 11, the driving method provided by the embodiment of the present disclosure further comprises an emission continuation period within the display period of one frame F. The emission continuation period includes at least one shutdown sub-period and at least one emission sub-period. For instance, the emission continuation period includes n shutdown sub-periods (t51 . . . t5n) and n emission sub-periods (t61 . . . t6n). In the shutdown sub-period, the light emitting control signal EM is set to be a turn-off voltage; the reset control signal Reset is set to be a turn-off voltage; the first scanning signal Gate is set to be a turn-off voltage; the second scanning signal Scan is set to be a turn-on voltage; and the data signal Data is set to be an ineffective data signal. In the emission sub-period, the light emitting control signal EM is set to be a turn-on voltage; the reset control signal Reset is set to be a turn-off voltage; the first scanning signal Gate is set to be a turn-off voltage; the second scanning signal Scan is set to be a turn-on voltage; and the data signal Data is set to be an ineffective data signal. The setting allows the OLED to switch between luminous state and non-luminous state for multiple times within the display period of one frame, increases the luminous frequency of the OLED, and reduces or avoids the flicker phenomenon caused by visual retention.

For instance, the flicker phenomenon can be well improved when three shutdown sub-periods and three emission sub-periods are included within the display period of one frame, namely n=3.

For instance, in the driving method provided by the embodiment of the present disclosure, the ratio of the sum of the duration of the emission period t4 and the total duration of all the emission sub-periods to the display period of one frame F is adjustable.

For instance, in the driving method provided by the embodiment of the present disclosure, the duration of each shutdown sub-period is equal to the sum of the duration of the reset period t1, the duration of the data write and threshold compensation period t2, and the duration of the voltage drop compensation period t3; and the duration of each emission sub-period is equal to the duration of the emission period t4. The setting can ensure the same luminous duration of the OLED each time and equal interval between emission periods, simplify timing control, and ensure the stability of circuits.

FIG. 12A-12H are schematic structural diagrams of respective layers of a pixel circuit provided by some embodiments of the present disclosure. The positional relationship of respective elements in the pixel circuit on a backplane will be described below with reference to FIGS. 12A-12H. The example shown in FIGS. 12A-12H takes the pixel circuit shown in FIG. 3B as an example.

Figure 12C:
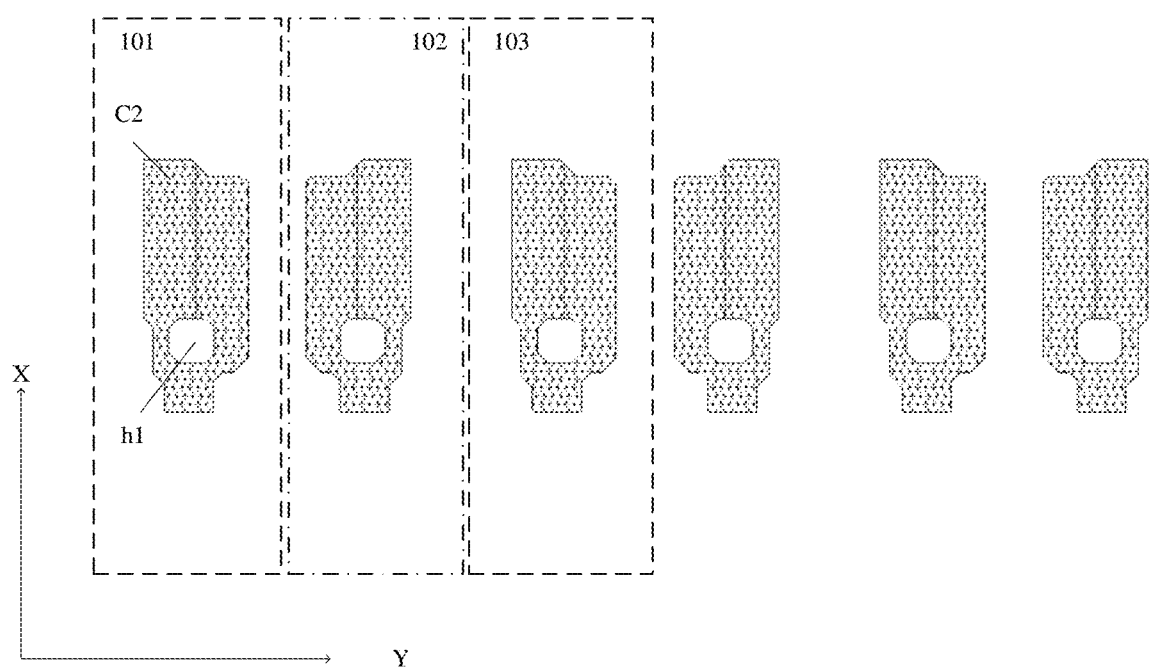

For example, as shown in FIGS. 12A-12F, each pixel circuit may include an active semiconductor layer 310, a first conductive layer 320, a second conductive layer 330, a source-drain metal layer 340, an anode layer 350, and a pixel defining layer 360. FIG. 12G is a schematic diagram showing the lamination position relationship among the active semiconductor layer 310, the first conductive layer 320, the second conductive layer 330, and the source-drain metal layer 340. FIG. 12H is a schematic diagram showing the lamination position relationship of the active semiconductor layer 310, the first conductive layer 320, the second conductive layer 330, the source-drain metal layer 340, the anode layer 350, and the pixel defining layer 360.

For example, in FIGS. 12A-12D, each dotted rectangular frame or each dot-dash-line rectangular frame represents the area corresponding to one pixel circuit 100. In FIGS. 12A-12D, two dotted rectangular frames correspond to a first pixel circuit 101 and a third pixel circuit 103, respectively, and the dot-dash-line rectangular frame corresponds to a second pixel circuit 102. The first pixel circuit 101, the second pixel circuit 102, and the third pixel circuit 103 are all the pixel circuit 100 shown in FIG. 3B. The first pixel circuit 101, the second pixel circuit 102, and the third pixel circuit 103 are located in the same row, the first pixel circuit 101 and the second pixel circuit 102 are adjacent to each other, the second pixel circuit 102 and the third pixel circuit 103 are adjacent to each other, and the second pixel circuit 102 is located between the first pixel circuit 101 and the third pixel circuit 103. The following embodiments are described by taking the first pixel circuit 101 as an example.

For example, FIG. 12A shows the active semiconductor layer 310 of the first pixel circuit 101. The active semiconductor layer 310 may be patterned to form on a base substrate using a semiconductor material. The active semiconductor layer 310 can be used to manufacture the active layer of the driving transistor DT, the active layer of the first transistor T1, the active layer of the second transistor T2, the active layer of the third transistor T3, and the active layer of the fourth transistor T4, the active layer of the fifth transistor T5, and the active layer of the sixth transistor T6, each active layer may include a source region, a drain region, and a channel region between the source region and the drain region. The channel region is used to form the channel of the transistor.

For example, as shown in FIG. 12A, in a first direction X, the active layer of the fourth transistor T4, the active layer of the fifth transistor T5, and the active layer of the sixth transistor T6 are located on a first side, such as an upper side in FIG. 12A, of the active layer of the driving transistor DT; the active layer of the first transistor T1, the active layer of the second transistor T2, and the active layer of the third transistor T3 are located on a second side, such as a lower side in FIG. 12A, of the active layer of the driving transistor DT.

For example, the active semiconductor layer 310 may be made of amorphous silicon, polycrystalline silicon, oxide semiconductor materials, or the like. It should be noted that the above source region and drain region may be regions doped with n-type impurities or p-type impurities. In an embodiment of the present disclosure, the doped source region corresponds to a source electrode of a transistor (e.g., a first electrode of the transistor), and the doped drain region corresponds to a drain electrode of the transistor (e.g., a second electrode of the transistor).

For example, a gate insulating layer (not shown) is formed on the above-mentioned active semiconductor layer 310 to protect the above-mentioned active semiconductor layer 310. FIG. 12B shows a first conductive layer 320 of the first pixel circuit 101. The first conductive layer 320 is disposed on the gate insulating layer and is insulated from the active semiconductor layer 310.

It should be noted that respective rectangular frames in FIG. 12A shows various portions where the first conductive layer 320 overlaps the active semiconductor layer 310.

For example, in some embodiments, as shown in FIG. 12A, the driving transistor DT further includes an active layer. A rectangular frame dt1 in FIG. 12A shows the active layer of the driving transistor DT. The active layer of the driving transistor DT comprises a curved portion cv1, and a shape of the curved portion cv1 of the active layer of the driving transistor DT is an S-shape.

For example, a length of the curved portion cv1 is greater than a width of the curved portion cv1. It should be noted that, in some embodiments, the length of the curved portion cv1 is the length of the channel of the driving transistor DT, and the width of the curved portion cv1 is the width of the channel of the driving transistor DT. As shown in FIG. 12A, the length of the curved portion cv1 is the length of a curve line segment dw1 shown in the curved portion cv1, and the width of the curved portion cv1 is the length of a straight line segment dw2 with double arrows shown in the curved portion cv1.

For example, the first conductive layer 320 may include a first end C1 of the storage capacitor C1, a first scanning signal line Ga, a second scanning signal line Sa, a reset control signal line Rt1, a reset control signal line Rt2, a light emitting control signal line E, and gate electrodes of the driving transistor DT, the first transistor T1, the second transistor T2, the third transistor T3, the fourth transistor T4, the fifth transistor T5, and the sixth transistor T6. For example, the reset control signal line Rt1 is a reset control signal line corresponding to the pixel circuit shown by the dotted rectangular frame in FIG. 12A, and the reset control signal line Rt2 is a reset control signal line corresponding to the pixel circuit in the next row adjacent to the pixel circuit shown by the dotted rectangular frame in FIG. 12A.

For example, as shown in FIG. 12B, the reset control signal line Rt1, the reset control signal line Rt2, the second scanning signal line Sa, the light emitting control signal line E, and the first scanning signal line Ga generally extend in a second direction Y.

For example, as shown in FIG. 12B, in the first direction X, the reset control signal line Rt2, the second scanning signal line Sa, the light emitting control signal line E, the first scanning signal line Ga, and the reset control signal line Rt1 are sequentially arranged. That is, the second scanning signal line Sa is located between the reset control signal line Rt2 and the light emitting control signal line E, and the light emitting control signal line E is located between the second scanning signal line Sa and the first scanning signal line Ga, the first scanning signal line Ga is located between the light emitting control signal line E and the reset control signal line Rt1.

For example, the reset control signal line Rt1 is electrically connected to the gate electrode of the first transistor T1 for controlling the first transistor T1; the reset control signal line Rt2 is electrically connected to the gate electrode of the sixth transistor T6 for controlling the sixth transistor T6; the first scanning signal line Ga is electrically connected to the gate electrode of the second transistor T2 and the gate electrode of the third transistor T3 for controlling the second transistor T2 and the third transistor T3; the second scanning signal line Sa is electrically connected to the gate electrode of the fourth transistor T4 for controlling the fourth transistor T4; and the light emitting control signal line E is electrically connected to the gate electrode of the fifth transistor T5 for controlling the fifth transistor T5.

For example, in a direction perpendicular to the base substrate, the reset control signal line Rt1 at least partially overlaps with the active layer of the first transistor T1; the reset control signal line Rt2 at least partially overlaps with the active layer of the sixth transistor T6; the first scanning signal line Ga at least partially overlaps with the active layer of the second transistor T2 and the third transistor T3; the second scanning signal line Sa at least partially overlaps with the active layer of the fourth transistor T4; and the light emitting control signal line E at least partially overlaps with the active layer of the fifth transistor T5.

For example, as shown in FIG. 12B, the first end C1 of the storage capacitor C is located between the light emitting control signal line E and the first scanning signal line Ga.

For example, the first transistor T1 is a double gate transistor, that is, the first transistor T1 includes a first gate electrode and a second gate electrode, as shown in FIGS. 12A and 12B, in the direction perpendicular to the base substrate, the gate electrode of the first transistor T1 is two portions, which overlap with the active semiconductor layer 310, of the reset control signal line Rt1, the two portions are the first gate electrode and the second gate electrode of the first transistor T1, respectively. A rectangular frame t11 in FIG. 12A shows a first portion, which corresponds to the first gate electrode of the first transistor T1, of the active layer of the first transistor T1, and a rectangular frame t12 in FIG. 12A shows a second portion, which corresponds to the second gate electrode of the first transistor T1, of the active layer of the first transistor T1. For example, the length of the channel corresponding to the first gate electrode of the first transistor T1 is the length of the active layer in the rectangular frame t11 (that is, the length of the curve line segment shown in the active layer in the rectangular frame t11), the length of the channel corresponding to the second gate electrode of the first transistor T1 is the length of the active layer in the rectangular frame t12.

For example, as shown in FIG. 12A, the first transistor T1 includes an active layer, and the active layer of the first transistor T1 includes a first portion shown in a rectangular frame t11 and a second portion shown in a rectangular frame t12 in FIG. 12A. The active layer of the first transistor T1 includes a curved portion cv2. The curved portion cv2 of the active layer of the first transistor T1 is located in the first portion shown by the rectangular frame t11, and a shape of the curved portion cv2 is a shape like "~".

For example, as shown in FIGS. 12A and 12B, a line width of a portion of the reset control signal line Rt1 corresponding to the curved portion cv2 of the active layer of the first transistor T1 becomes wider, so that the portion of the reset control signal line Rt1 corresponding to the curved portion cv2 can completely cover the curved portion cv2 of the active layer of the first transistor T1. For example, the portion of the reset control signal line Rt1 protrudes from the reset control signal line Rt1 in a direction away from the first scanning signal line Ga.

For example, the length of the curved portion cv2 is greater than the width of the curved portion cv2, and the length of the curved portion cv2 is also greater than the line width (that is, the length of the straight line segment dw5 with double arrows shown in FIG. 12B) of the reset control signal line Rt1 corresponding to the curved portion cv2. It should be noted that, as shown in FIG. 12A, the length of the curved portion cv2 is the length of the curve line segment dw3 shown in the curved portion cv2, and the width of the curved portion cv2 is the length of the straight line segment dw4 shown in the curved portion cv2.

For example, the second transistor T2 is a double gate transistor, that is, the second transistor T2 includes a first gate electrode and a second gate electrode, as shown in FIGS. 12A and 12B, in the direction perpendicular to the base substrate, the gate electrode of the second transistor T2 is a first portion, which overlaps with the active semiconductor layer 310, of the first scanning signal line Ga, for example, the first portion includes two sub-portions arranged along the first direction X, the two sub-portions are the first gate electrode and the second gate electrode of the second transistor T2, respectively. The rectangular frame t21 in FIG. 12A shows the active layer, which corresponds to the first gate electrode of the second transistor T2, of the second transistor T2; the rectangular frame t22 in FIG. 12A shows the active layer, which corresponds to the second gate electrode of the second transistor T2, of the second transistor T2. For example, the length of the channel corresponding to the first gate electrode of the second transistor T2 is the length of the active layer in the rectangular frame t21, and the length of the channel corresponding to the second gate electrode of the second transistor T2 is the length of the active layer in the rectangular frame t22.

It should be noted that in the example shown in FIG. 12B, in combination with FIGS. 12B and 12D, in the second direction Y, on both sides of the reset voltage line Vin (the reset voltage line Vin will be described in detail below with reference to FIG. 12D), the first scanning signal line Ga includes a main body portion extending in the second direction Y and two protruding portions that protrude from the main body portion in the first direction X, the two protruding portions are respectively a first protruding portion and a second protruding portion. The first protruding portion corresponds to the first pixel circuit 101 and the second protruding portion corresponds to the second pixel circuit 102. In the second direction Y, a first extension portion protrudes from the first protruding portion and extends in a direction from the first pixel circuit 101 to the second pixel circuit 102, a portion, which overlaps with the active semiconductor layer 310, of the first extension portion is the first gate electrode of the second transistor T2 in the first pixel circuit 101; a second extension portion protrudes from the second protruding portion and extends in a direction from the second pixel circuit 102 to the first pixel circuit 101, a portion, which overlaps with the active semiconductor layer 310, of the second extension portion is the first gate electrode of the second transistor T2 in the second pixel circuit 102. In the example shown in FIG. 12B, the first extension portion and the second extension portion correspond to different protruding portions, namely, the first protruding portion and the second protruding portion.

In the present disclosure, the layout diagram of the first gate electrode of the second transistor T2 is not limited to the example shown in FIG. 12B. In other embodiments, the first scanning signal line Ga includes a main body portion extending in the second direction Y and a protruding portion, the protruding portion protrudes from the main body portion in the first direction X, in the direction perpendicular to the base substrate, the protruding portion substantially overlaps with the reset voltage line Vin. In the second direction Y, a first extension portion protrudes from the protruding portion and extends in a direction from the second pixel circuit 102 to the first pixel circuit 101, and a portion, which overlaps with the active semiconductor layer 310, of the first extension portion is the first gate electrode of the second transistor T2 in the first pixel circuit 101; a second extension portion protrudes from the protruding portion and extends in a direction from the first pixel circuit 101 to the second pixel circuit 102, and a portion, which overlaps with the active semiconductor layer 310, of the second extension portion is the first gate electrode of the second transistor T2 in the second pixel circuit 101. That is, the first extension portion and the second extension portion may share the same protruding portion. For example, the first extension portion and the second extension portion may be provided integrally and may be a straight line segment extending in the second direction Y. The first extension portion, the second extension portion, the protruding portion, and the main body portion of the first scanning signal line Ga form a shape like an I-shaped in the area of two pixel circuits (for example, the first pixel circuit 101 and the second pixel circuit 102) sharing the same reset voltage line Vin.

For example, the active semiconductor layer 310 includes a conductive portion cp between the channel of the active layer of the second transistor T2 and the channel of the active layer of the fifth transistor T5, in the first direction X, the conductive portion cp is located between the light emitting control signal line E and the first scanning signal line Ga. The length of the conductive portion cp in the first direction X is greater than the length of the curved portion cv1 of the active layer of the driving transistor DT in the first direction X. For example, as shown in FIG. 12A, taking the third pixel circuit 103 as an example, the length of the conductive portion cp may be the length of the straight line segment dw6 with double arrows, and the length of the curved portion cv1 of the active layer of the driving transistor DT in the first direction X may be the length of the straight line segment dw7 with double arrows, that is, the length of the straight line segment dw6 with double arrows is smaller than the length of the straight line segment dw7 with double arrows.

For example, the channel of the active layer of the second transistor T2, the channel of the active layer of the fifth transistor T5, and the conductive portion cp are integrally provided.

For example, the conductive portion cp corresponds to the second electrode of the driving transistor DT, the second electrode of the second transistor T2, and the second electrode of the fifth transistor T5.

It should be noted that in order to clearly show the conductive portion between the channel of the active layer of the second transistor T2 and the channel of the active layer of the fifth transistor T5, FIG. 12A shows a conductive portion cp between the channel of the active layer of the second transistor and the channel of the active layer of the fifth transistor in the area corresponding to the third pixel circuit 103, however, it can be understood that the structure of the active semiconductor layer of the first pixel circuit 101 is the same as the structure of the active semiconductor layer of the third pixel circuit 103, that is, the corresponding position in the area corresponding to the first pixel circuit 101 may also has a conductive portion.

For example, as shown in FIGS. 12A and 12B, in the direction perpendicular to the base substrate, the gate electrode of the third transistor T3 is a second portion, which overlaps with the active semiconductor layer 310, of the first scanning signal line Ga, the gate electrode of the fourth transistor T4 is a portion, which overlaps with the active semiconductor layer 310, of the second scanning signal line Sa, the gate electrode of the fifth transistor T5 is a portion, which overlaps with the active semiconductor layer 310, of the light emitting control signal line E, and the gate electrode of the sixth transistor T6 is a portion, which overlaps with the active semiconductor layer 310, of the reset control signal line Rt2. The gate electrode of the driving transistor DT may be the first end C1 of the storage capacitor C.

For example, as shown in FIG. 12A, in the first direction X, the gate electrode of the first transistor T1, the gate electrode of the second transistor T2, and the gate electrode of the third transistor T3 are all located on the first side, such as an upper side, of the gate electrode of the driving transistor DT. The gate electrode of the fourth transistor T4, the gate electrode of the fifth transistor T5, and the gate electrode of the sixth transistor T5 are all located on the second side, such as a lower side, of the gate electrode of the driving transistor DT. The first side and the second side of the gate electrode of the driving transistor DT are two opposite sides of the gate electrode of the driving transistor DT in the first direction X.

For example, a first insulating layer (not shown) is formed on the above-mentioned first conductive layer 320 for protecting the above-mentioned first conductive layer 320. FIG. 12C shows the second conductive layer 330 of the first pixel circuit 101. The second conductive layer 330 includes the second end C2 of the storage capacitor C. In the direction perpendicular to the base substrate, the first end C1 of the storage capacitor C and the second end C2 of the storage capacitor C at least partially overlap to form the storage capacitor C.

For example, the second end C2 of the storage capacitor C includes a hole h1, and the first electrode of the second transistor T2 is electrically connected to the gate electrode of the driving transistor DT through the hole h1.

For example, a second insulating layer (not shown) is formed on the above-mentioned second conductive layer 330 to protect the above-mentioned second conductive layer 330. FIG. 12D shows the source-drain metal layer 340 of the first pixel circuit 101. The source-drain metal layer 340 includes a data signal line Vda, a first power line VD, a reset voltage line Vin, a first electrode FC1 and a second electrode SC1 of the first transistor T1, a first electrode FC2 of the second transistor T2, a first electrode FC3 and a second electrode SC3 of the third transistor T3, a first electrode FC4 and a second electrode SC4 of the fourth transistor T4, and a first electrode FC5 and a second electrode SC5 of the fifth transistor T5, a first electrode FC6 and a second electrode SC6 of the sixth transistor T6, a first electrode FCD and a second electrode SCD of the driving transistor DT, and respective connection electrodes Co1-Co8.

Figure 12D:
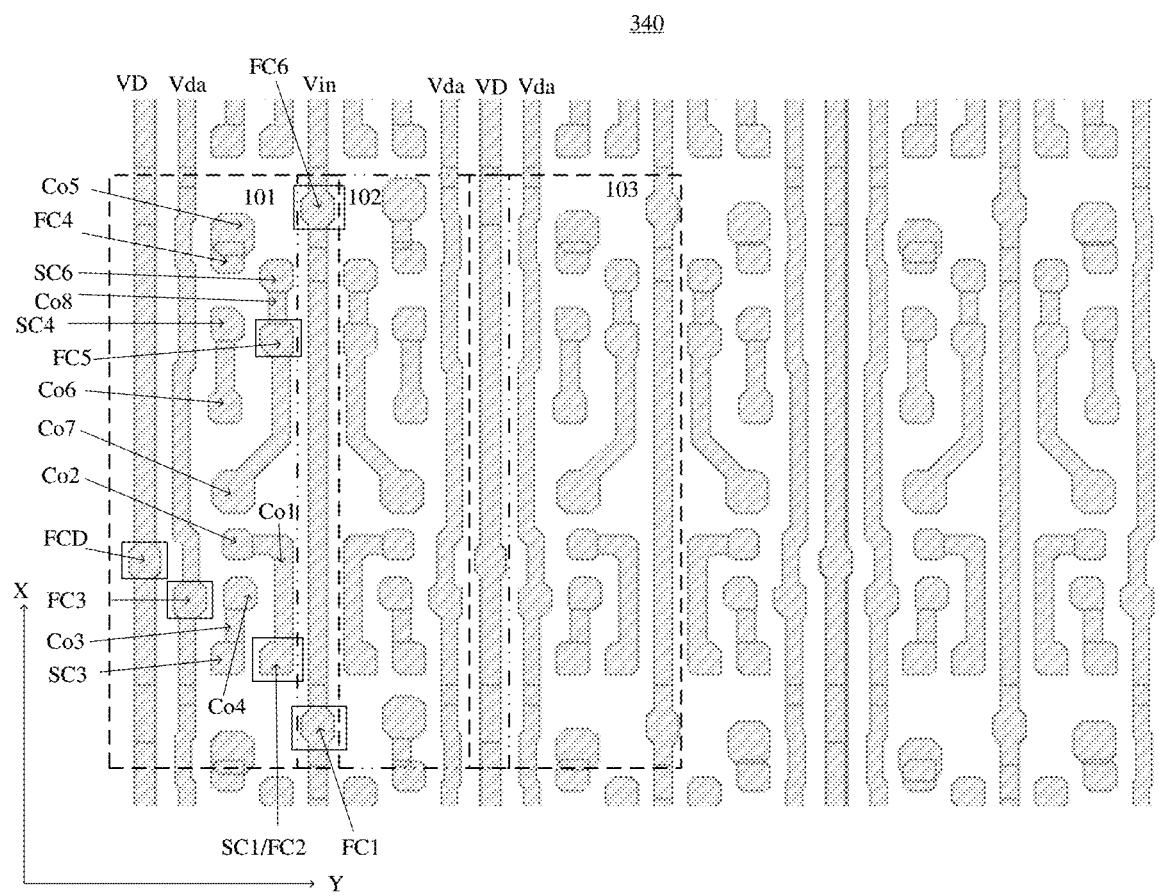

For example, as shown in FIG. 12D, the first electrode FCD of the driving transistor DT is connected to the first power line VD, for example, the first electrode FCD of the driving transistor DT is a portion of the first power line VD, and the first electrode FCD of the driving transistor DT is connected to a first conductive portion (source region or drain region) in the active semiconductor layer 310 through a hole.

For example, as shown in FIG. 12D, the first electrode FC1 of the first transistor T1 is connected to the reset voltage line Vin. For example, the first electrode FC1 of the first transistor T1 is a portion of the reset voltage line Vin. The first electrode FC1 of the first transistor T1 is connected to a second conductive portion (source region or drain region) in the active semiconductor layer 310 through a hole. The second electrode SC1 of the first transistor T1, the first electrode FC2 of the second transistor T2, and the connection electrode Co1 are integrally provided, and the second electrode SC1 of the first transistor T1 and the first electrode FC2 of the second transistor T2 are connected to a third conductive portion (source region or drain region) in the active semiconductor layer 310 through a hole. The second electrode SC1 of the first transistor T1 and the first electrode FC2 of the second transistor T2 are connected to the connection electrode Co2 through the connection electrode Co1, and the connection electrode Co2 is connected to the first end C1 of the storage capacitor C in the first conductive layer 320 through a hole (including the hole h1 in FIG. 12C), so that the second electrode SC1 of the first transistor T1 and the first electrode FC2 of the second transistor T2 are electrically connected to the first end C1 of the storage capacitor C. The first end C1 of the storage capacitor C is multiplexed as the gate electrode of the driving transistor DT.

For example, as shown in FIG. 12D, the first electrode FC3 of the third transistor T3 is connected to the data signal line Vda. For example, the first electrode FC3 of the third transistor T3 is a portion of the data signal line Vda, and the first electrode FC3 of the third transistor T3 is connected to a fourth conductive portion (source region or drain region) in the active semiconductor layer 310 through a hole. The second electrode SC3 of the third transistor T3 is connected to a fifth conductive portion (source region or drain region) in the active semiconductor layer 310 through a hole. The second electrode SC3 of the third transistor T3 is also connected to the connection electrode Co3, the connection electrode Co3 and the connection electrode Co4 are connected, and the connection electrode Co4 is connected to the second end C2 of the storage capacitor C in the second conductive layer 330 through a hole, so that the second electrode SC3 of the third transistor T3 is connected to the second end C2 of the storage capacitor C.

For example, as shown in FIG. 12D, the first electrode FC4 of the fourth transistor T4 is connected to a sixth conductive portion (source region or drain region) in the active semiconductor layer 310 through a hole, the first electrode FC4 of the fourth transistor T4 is also connected to the connection electrode Co5, and the connection electrode Co5 is connected to the reference voltage line Vre in the anode layer 350 (the layout of the anode layer 350 will be described in detail in conjunction with FIG. 12E below) through a hole (including a hole h2 in FIG. 12E), so that the first electrode FC4 of the fourth transistor T4 is electrically connected to the reference voltage line Vre. The second electrode SC4 of the fourth transistor T4 is connected to a seventh conductive portion (source region or drain region) in the active semiconductor layer 310 through a hole, the second electrode SC4 of the fourth transistor T4 is also connected to the connection electrode Co6, and the connection electrode Co6 is connected to the second end C2 of the storage capacitor C in the second conductive layer 330 through a hole, so that the second electrode SC4 of the fourth transistor T4 is electrically connected to the second end C2 of the storage capacitor C.

Figure 12E:
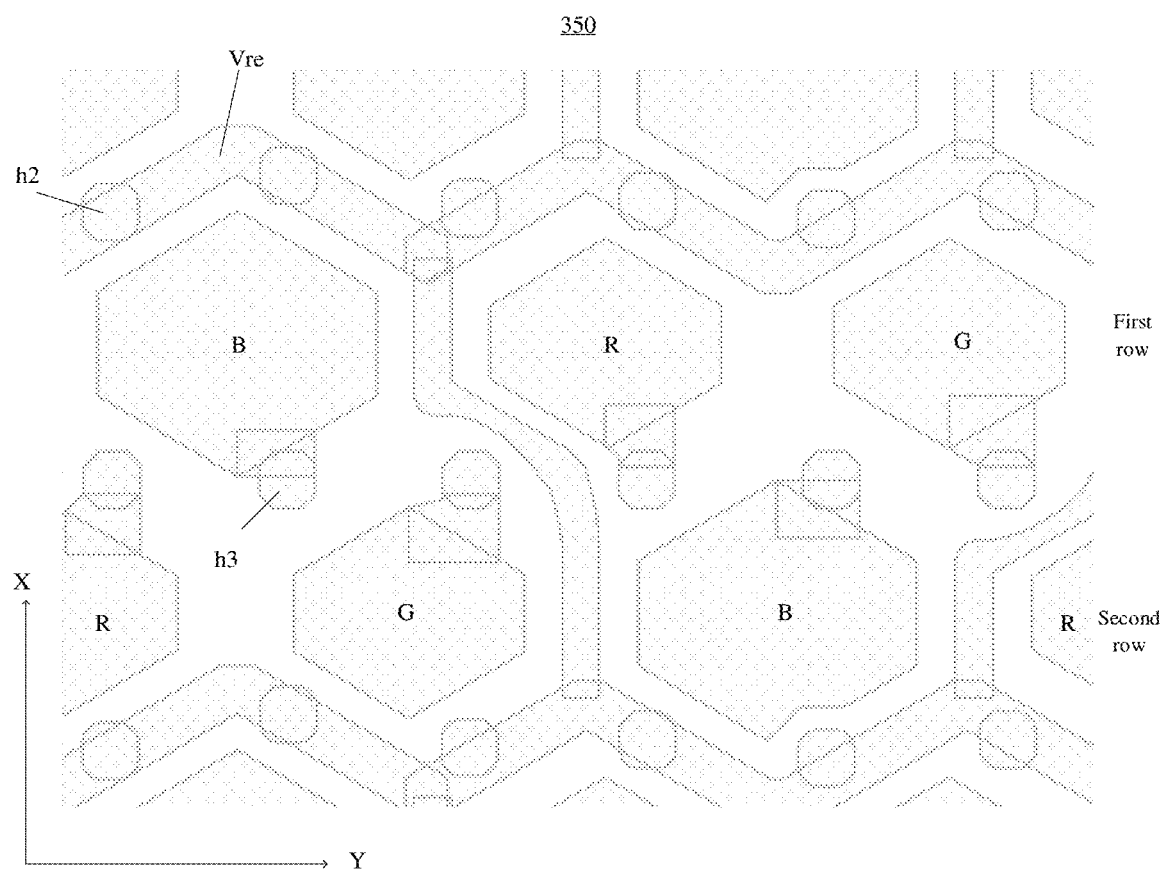

For example, as shown in FIG. 12D, the first electrode FC5 of the fifth transistor T5 is connected to the connection electrode Co7, and the connection electrode Co7 is connected to the first electrode of the light emitting element in the anode layer 350 through a hole (including the hole h3 in FIG. 12E). For example, the first electrode FC5 of the fifth transistor T5 and the connection electrode Co7 are provided integrally. The first electrode FC5 of the fifth transistor T5 is also connected to the connection electrode Co8, the second electrode SC6 of the sixth transistor T6 is connected to the connection electrode Co8, so that the first electrode FC5 of the fifth transistor T5 and the second electrode SC6 of the sixth transistor T6 are electrically connected. The first electrode FC6 of the sixth transistor T6 is connected to the reset voltage line Vin. For example, the first electrode FC6 of the sixth transistor T6 is a portion of the reset voltage line Vin, and the first electrode FC6 of the sixth transistor T6 is connected to an eighth conductive portion (source region or drain region) in the active semiconductor layer 310 through a hole.

For example, the first power line VD, the data signal line Vda, and the reset voltage line Vin generally extend along the first direction X; in the second direction Y, the first power line VD, the data signal line Vda, and the reset voltage lines Vin corresponding to the same pixel circuit are sequentially arranged, that is, the data signal line Vda is located between the first power line VD and the reset voltage line Vin.

For example, as shown in FIG. 12D, the first pixel circuit 101 and the second pixel circuit 102 share the same reset voltage line Vin, and the shared reset voltage line Vin is located between the first pixel circuit 101 and the second pixel circuit 102. The first pixel circuit 101 and the second pixel circuit 102 are approximately mirror-symmetric with respect to the shared reset voltage line Vin.

For example, as shown in FIG. 12D, the second pixel circuit 102 and the third pixel circuit 103 share the same first power line VD, and the shared first power line VD is located between the second pixel circuit 102 and the third pixel circuit 103, for example, the shared first power line VD is located between the data signal line Vda corresponding to the second pixel circuit 102 and the data signal line Vda corresponding to the third pixel circuit 103. The second pixel circuit 102 and the third pixel circuit 103 are approximately mirror-symmetric with respect to the shared first power line VD.

It should be noted that in FIG. 12D, the first power line VD, the data signal line Vda, and the reset voltage line Vin, which overlap with the dotted rectangular frame corresponding to the first pixel circuit 101, are the first power line VD, the data signal line Vda, and the reset voltage line Vin corresponding to the first pixel circuit 101. Similarly, the first power line VD, the data signal line Vda, and the reset voltage line Vin, which overlap with the dotted rectangular frame corresponding to the second pixel circuit 102, are the first power line VD, the data signal line Vda, and the reset voltage line Vin corresponding to the second pixel circuit 102. The first power line VD, the data signal line Vda, and the reset voltage line Vin, which overlap with the dotted rectangular frame corresponding to the third pixel circuit 103, are the first power line VD, the data signal line Vda, and the reset voltage line Vin corresponding to the third pixel circuit 103.

It should be noted that in order to clearly show the sharing of signal lines, in FIG. 12D, the area corresponding to the first pixel circuit 101 and the area corresponding to the second pixel circuit 102 overlap each other, and the area corresponding to the second pixel circuit 102 and the area corresponding to the third pixel circuit 103 overlap each other. In the remaining drawings, for the sake of clarity, the area corresponding to the first pixel circuit 101, the area corresponding to the second pixel circuit 102, and the area corresponding to the third pixel circuit 103 do not overlap each other, but this does not constitute a limitation on the present disclosure. In addition, the area shown by the dotted rectangular frame also represents only the approximate area of the pixel circuit, and the actual area of the pixel circuit is related to the specific arrangement positions of the transistors and the capacitors in the pixel circuit.

For example, a third insulating layer (not shown) is formed on the above-mentioned source-drain metal layer 340 to protect the above-mentioned source-drain metal layer 340. FIG. 12E shows the anode layer 350 of the first pixel circuit 101. The anode layer 350 includes the anode (i.e., first electrode) R/G/B of the light emitting element and the reference voltage line Vre. That is, the reference voltage line Vre and the first electrode of the light emitting element are located in the same layer and are formed of the same material.

For example, as shown in FIG. 12E, the reference voltage line Vre is arranged in a mesh shape along the first direction X and the second direction Y.

For example, as shown in FIG. 12E, the anode layer 350 further includes holes h2 and holes h3. The first electrode of the fourth transistor T4 is located in the source-drain metal layer 340, and the reference voltage line Vre is located in the anode layer 350, that is, the reference voltage line re and the first electrode of the fourth transistor T4 are located in different layers, and the reference voltage line re is electrically connected to the first electrode FC4 of the fourth transistor T4 through the hole h2. The first electrode of the light emitting element is connected to the first electrode FC5 of the fifth transistor T5 through the hole h3.

For example, in some embodiments, a plurality of sub-pixels located in odd rows are arranged in a BRGBRG manner, and a plurality of sub-pixels located in even rows are arranged in an RGBRGB manner, for example, as shown in FIG. 12E, the plurality of sub-pixels located in a first row are arranged in a BRGBRG manner, and the plurality of sub-pixels located in a second row are arranged in a RGBRGB manner. It should be noted that, the plurality of sub-pixels in the display panel may include a red sub-pixel, a blue sub-pixel, and a green sub-pixel, in FIG. 12E, B represents the anode of the light emitting element in the blue sub-pixel, G represents the anode of the light emitting element in the green sub-pixel, and R represents the anode of the light emitting element in the red sub-pixel. For example, the area of the anode of a blue sub-pixel is larger than the area of the anode of a green sub-pixel, and is larger than the area of the anode of a red sub-pixel.

Figure 12F:
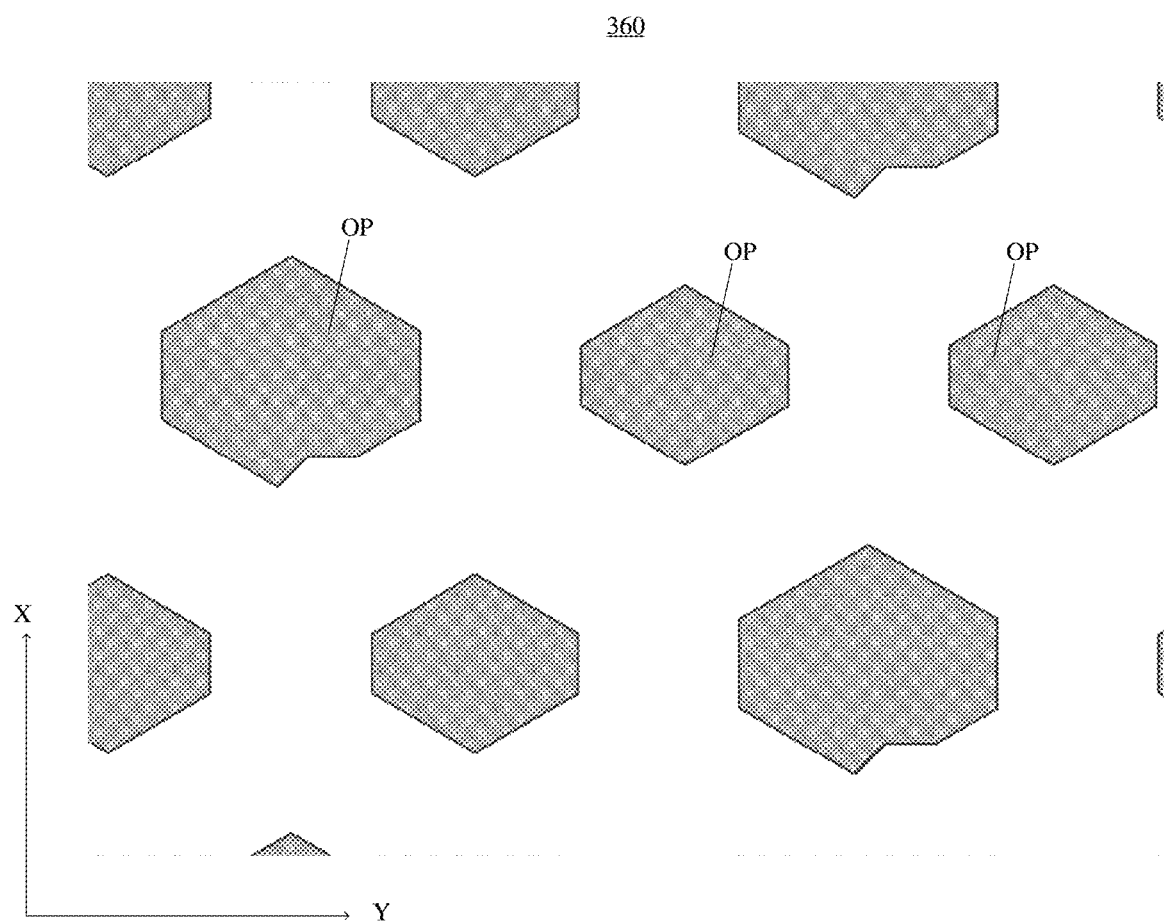
Figure 12G:
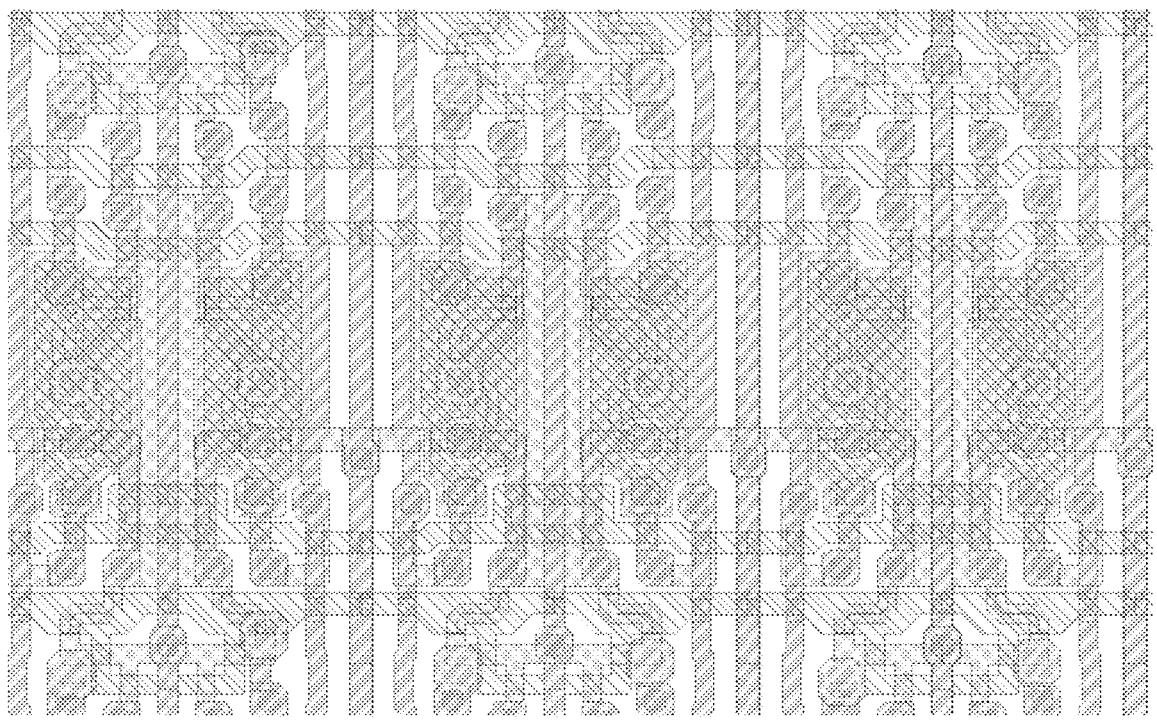
Figure 12H:
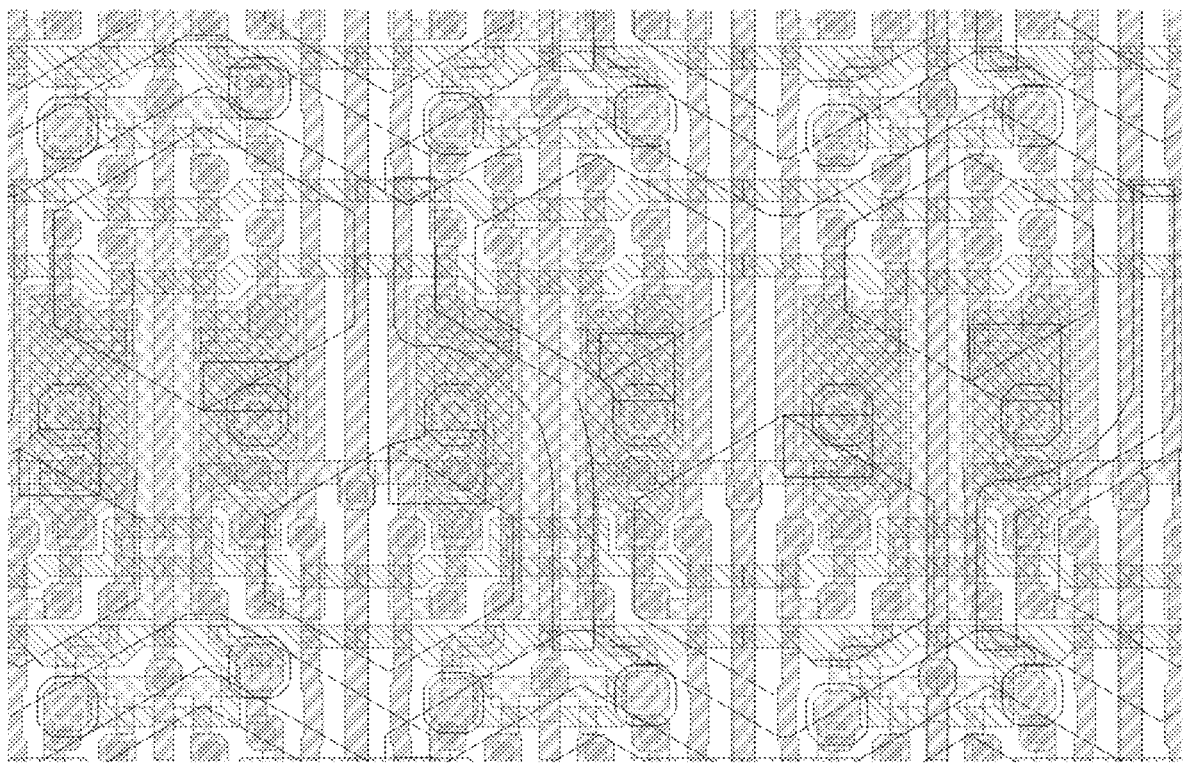

For example, FIG. 12F shows the pixel defining layer 360 of the first pixel circuit 101, and the pixel defining layer 360 includes a plurality of pixel openings OP. In the direction perpendicular to the base substrate, each pixel opening OP exposes at least a portion of a corresponding anode R/G/B. For example, the area of the pixel opening of a blue sub-pixel is larger than the area of the pixel opening of a green sub-pixel, and is larger than the area of the pixel opening of a red sub-pixel. In some embodiments, the area of the pixel opening of the green sub-pixel may be approximately the same as the area of the pixel opening of the red sub-pixel. In some other embodiments, the area of the pixel opening of the green sub-pixel is smaller than the area of the pixel opening of the red sub-pixel.

An embodiment of the present disclosure provides a pixel circuit, a display panel, a display device and a driving method, which can realize the IR drop compensation and the threshold voltage compensation of the display panel, improve the uniformity of drive current, improve the display uniformity of the display panel, meanwhile, reduce the leakage current to ensure high contrast in the black state, and ensure accurate display under a low-grayscale condition by adjustment of the ratio of the emission period in the display period of one frame.

Although detailed description has been given above to the present disclosure with reference to general description and preferred embodiment, it is apparent to those skilled in the art that some modifications or improvements may be made on the basis of the embodiments of the present disclosure. Therefore, the modifications or improvements made without departing from the spirit of the present disclosure shall all fall within the scope of protection of the present disclosure.

What is claimed is:

1. A pixel circuit, comprising:
    a light emitting element, comprising a first electrode;
    a driving transistor, comprising a gate electrode, wherein the driving transistor is coupled to a first supply voltage, and the driving transistor is configured to drive the light emitting element to emit light according to a voltage of the gate electrode of the driving transistor;
    a light emitting control circuit, configured to receive a light emitting control signal and control a connection between the light emitting element and the driving transistor to be turned on or off according to the light emitting control signal;
    a reset circuit, configured to receive a reset control signal and write a reset voltage into the gate electrode of the driving transistor according to the reset control signal;
    a threshold compensation circuit, configured to receive a first scanning signal and write a compensating voltage into the gate electrode of the driving transistor according to the first scanning signal, wherein the compensating voltage comprises a threshold voltage of the driving transistor;
    a first data write circuit, configured to receive the first scanning signal and a data signal and write the data signal into the driving transistor according to the first scanning signal;
    an initializing circuit, configured to write an initializing voltage into the first electrode of the light emitting element,
    wherein the reset circuit comprises a first transistor, and the first data write circuit comprises a third transistor, and a channel length-width ratio of the first transistor is greater than a channel length-width ratio of the third transistor.

2. The pixel circuit according to claim 1, wherein the light emitting element further comprises a second electrode,
    the second electrode of the light emitting element is configured to receive a second supply voltage, a difference between the initializing voltage and the second supply voltage is in a range of 0 to 3 volts, or
    the initializing voltage is less than or equal to the second supply voltage.

3. The pixel circuit according to claim 1, wherein the first transistor is a double-gate transistor, and the channel length-width ratio of the first transistor is in a range of 3 to 7.

4. The pixel circuit according to claim 1, wherein the threshold compensation circuit comprises a second transistor, the second transistor is a double-gate transistor, and a channel length-width ratio of the second transistor is in a range of 1 to 3.

5. The pixel circuit according to claim 1, wherein a channel length-width ratio of the driving transistor is in a range of 8 to 13.

6. The pixel circuit according to claim 1, wherein the driving transistor further comprises an active layer, the active layer of the driving transistor comprises a curved portion, and a shape of the curved portion of the active layer of the driving transistor is an S-shape.

7. The pixel circuit according to claim 1, wherein the first transistor comprises an active layer, and the active layer of the first transistor comprises a curved portion, and a shape of the curved portion of the active layer of the first transistor is a shape of "~".

8. The pixel circuit according to claim 1, wherein the reset voltage changes within a display period of one frame.

9. The pixel circuit according to claim 1, wherein the initializing voltage is a variable voltage, and the initializing voltage is positively correlated with the second supply voltage and varies with variance of the second supply voltage.

10. The pixel circuit according to claim 1, further comprising: a storage capacitor and a reference voltage write circuit,
wherein the storage capacitor comprises a first end and a second end, the first end of the storage capacitor is connected to the gate electrode of the driving transistor;
the reference voltage write circuit is connected to the second end of the storage capacitor, and is configured to receive a second scanning signal and write a reference voltage to the second end of the storage capacitor according to the second scanning signal.

11. The pixel circuit according to claim 10, wherein the threshold compensation circuit comprises a second transistor, the reference voltage write circuit comprises a fourth transistor, the light emitting control circuit comprises a fifth transistor, and the initializing circuit comprises a sixth transistor;
the gate electrode of the driving transistor is electrically connected with the first end of the storage capacitor; a first electrode of the driving transistor is electrically connected with a first power line to receive the first supply voltage;
the light emitting element further comprises a second electrode that is electrically connected with a second power line to receive a second supply voltage;
a gate electrode of the first transistor is electrically connected with a reset control signal line to receive the reset control signal; a first electrode of the first transistor is electrically connected with a reset voltage line to receive the reset voltage; and a second electrode of the first transistor is electrically connected with the gate electrode of the driving transistor;
a gate electrode of the second transistor is electrically connected with a first scanning signal line to receive the first scanning signal; a first electrode of the second transistor is electrically connected with the gate electrode of the driving transistor; and a second electrode of the second transistor is electrically connected with a second electrode of the driving transistor, the compensating voltage is a sum of the first supply voltage and the threshold voltage of the driving transistor;
a gate electrode of the third transistor is electrically connected with the first scanning signal line to receive the first scanning signal; a first electrode of the third transistor is electrically connected with a data signal line to receive the data signal; and a second electrode of the third transistor is electrically connected with the second end of the storage capacitor;
a gate electrode of the fourth transistor is electrically connected with a second scanning signal line to receive a second scanning signal; a first electrode of the fourth transistor is electrically connected with a reference voltage line to receive the reference voltage; and a second electrode of the fourth transistor is electrically connected with the second end of the storage capacitor;
a gate electrode of the fifth transistor is electrically connected with a light emitting control signal line to receive the light emitting control signal; a first electrode of the fifth transistor is electrically connected with the first electrode of the light emitting element; and a second electrode of the fifth transistor is electrically connected with the second electrode of the driving transistor; and
a gate electrode of the sixth transistor is electrically connected with the first scanning signal line or the reset control signal line to receive the first scanning signal or the reset control signal; a first electrode of the sixth transistor is electrically connected with an initializing voltage line to receive the initializing voltage; and a second electrode of the sixth transistor is electrically connected with the first electrode of the light emitting element.

12. The pixel circuit according to claim 11, wherein the reset voltage line and the initializing voltage line are a same signal line.

13. The pixel circuit according to claim 11, wherein the reference voltage line and the first electrode of the light emitting element are in a same layer and formed of a same material,
the reference voltage line and the first electrode of the fourth transistor are in different layers, and the reference voltage line is connected to the first electrode of the fourth transistor through a hole.

14. The pixel circuit according to claim 11, further comprising: an active semiconductor layer and a first conductive layer,
wherein the driving transistor further comprises an active layer, the second transistor further comprises an active layer, and the fifth transistor further comprises an active layer,
the light emitting control signal line and the first scanning signal line are in the first conductive layer, and in the first conductive layer, the light emitting control signal line and the first scanning signal line are arranged along a first direction and extend along a second direction,
the active layer of the driving transistor, the active layer of the second transistor, and the active layer of the fifth transistor are in the active semiconductor layer,
the active layer of the driving transistor comprises a curved portion, and a shape of the curved portion of the active layer of the driving transistor is an S-shape,
the active semiconductor layer comprises a conductive portion between a channel of the active layer of the second transistor and a channel of the active layer of the fifth transistor, in the first direction, the conductive portion is between the light emitting control signal line and the first scanning signal line,
a length of the conductive portion in the first direction is greater than a length of the curved portion of the active layer of the driving transistor in the first direction.

15. A display device comprising a plurality of sub-pixels, wherein each of the plurality of sub-pixels comprises the pixel circuit according to claim 1.

16. The display device according to claim 15, further comprising: an integrated driving circuit,
wherein the integrated driving circuit comprises a second supply voltage output sub-circuit and an initializing voltage output sub-circuit, the second supply voltage output sub-circuit is configured to output a second supply voltage, and the initializing voltage output sub-circuit is configured to output the initializing voltage,
the light emitting element further comprises a second electrode, the second electrode of the light emitting element is configured to receive the second supply voltage,
the second supply voltage output sub-circuit is coupled to the initializing voltage output sub-circuit, and the initializing voltage output sub-circuit is configured to receive the second supply voltage and adjust the initializing voltage according to the second supply voltage.

17. The display device according to claim 15, wherein the plurality of sub-pixels comprise a first sub-pixel and a second sub-pixel, the first sub-pixel and the second sub-pixel are adjacent,
a pixel circuit of the first sub-pixel and a pixel circuit of the second sub-pixel are connected to a same reset voltage line, or the pixel circuit of the first sub-pixel and the pixel circuit of the second sub-pixel are connected to a same first power line.

18. The display device according to claim 15, wherein the plurality of sub-pixels are arranged in N rows and M columns,
the plurality of sub-pixels comprise a first sub-pixel and a second sub-pixel,
the first sub-pixel is in a k-th row of the N rows, and the second sub-pixel is in a (k+1)-th row of the N rows,
an initializing circuit in a pixel circuit of the first sub-pixel and a reset circuit in a pixel circuit of the second sub-pixel are controlled by a same reset control signal line,
the initializing circuit in the pixel circuit of the first sub-pixel and a reset circuit in the pixel circuit of the first sub-pixel are controlled by different reset control signal lines,
wherein N, M, and k are positive integers, and k is less than N.

19. A driving method of the pixel circuit according to claim 1, comprising a reset period, a data write and threshold compensation period, a voltage drop compensation period, and an emission period within a display period of one frame, wherein
in the reset period, the light emitting control signal is set to be a turn-off voltage; the reset control signal is set to be a turn-on voltage; the first scanning signal is set to be a turn-off voltage; the second scanning signal is set to be a turn-on voltage; the data signal is set to be an ineffective data signal;
in the data write and threshold compensation period, the light emitting control signal is set to be a turn-off voltage; the reset control signal is set to be a turn-off voltage; the first scanning signal is set to be a turn-on voltage; the second scanning signal is set to be a turn-off voltage; the data signal is set to be an effective data signal;
in the voltage drop compensation period, the light emitting control signal is set to be a turn-off voltage; the reset control signal is set to be a turn-off voltage; the first scanning signal is set to be a turn-off voltage; the second scanning signal is set to be a turn-on voltage; the data signal is set to be an ineffective data signal; and
in the emission period, the light emitting control signal is set to be a turn-on voltage; the reset control signal is set to be a turn-off voltage; the first scanning signal is set to be a turn-off voltage; the second scanning signal is set to be a turn-on voltage; and the data signal is set to be an ineffective data signal.

20. The driving method according to claim 19, wherein during the display period of one frame, the data write and threshold compensation period and the emission period do not overlap in time.

* * * * *